US011994351B2

(12) United States Patent
Sasaki

(10) Patent No.: US 11,994,351 B2
(45) Date of Patent: May 28, 2024

(54) COOLING STRUCTURAL BODY, COOLING SYSTEM, HEAT GENERATOR AND CONSTRUCTION

(71) Applicant: Beji Sasaki, Tokyo (JP)

(72) Inventor: Beji Sasaki, Tokyo (JP)

(73) Assignee: Sasaki Beji, Tokyo (JP)

(*) Notice: Subject to any disclaimer, the term of this patent is extended or adjusted under 35 U.S.C. 154(b) by 610 days.

(21) Appl. No.: 16/496,400

(22) PCT Filed: Mar. 16, 2018

(86) PCT No.: PCT/JP2018/010409
§ 371 (c)(1),
(2) Date: Sep. 20, 2019

(87) PCT Pub. No.: WO2018/173942
PCT Pub. Date: Sep. 27, 2018

(65) Prior Publication Data
US 2021/0108868 A1 Apr. 15, 2021

(30) Foreign Application Priority Data

Mar. 22, 2017 (JP) ................................. 2017-055419
Dec. 6, 2017 (JP) ................................. 2017-234068

(51) Int. Cl.
*F28F 7/02* (2006.01)
*H01L 23/36* (2006.01)
(Continued)

(52) U.S. Cl.
CPC ................ *F28F 7/02* (2013.01); *H01L 23/36* (2013.01); *H02K 5/203* (2021.01); *F28D 7/00* (2013.01);
(Continued)

(58) Field of Classification Search
CPC ...... F28F 7/02; F28F 3/048; F28F 1/10; F28F 1/006; F28F 13/06; F28F 13/08;
(Continued)

(56) References Cited

U.S. PATENT DOCUMENTS 5,990,550 A 11/1999 Umezawa
7,329,033 B2 * 2/2008 Glovatsky ............. F21S 41/153
362/547

(Continued)

FOREIGN PATENT DOCUMENTS

CN 102415229 A 4/2012
CN 102573412 A 7/2012
(Continued)

OTHER PUBLICATIONS

First OA and Search Report from TW app. No. 107109553, dated Oct. 12, 2021, with machine English translation from Google Translate.
(Continued)

*Primary Examiner* — Joel M Attey
(74) *Attorney, Agent, or Firm* — Ladas & Parry, LLP

(57) ABSTRACT

To provide a cooling structural body which can enhance a cooling effect and can easily correspond to small-sizing and the like.
The cooling structural body includes a heat radiating part having a mounting surface 2a on which an electronic component 101 is directly or indirectly mounted. A medium flow path through which a medium can flow is provided in the heat radiating part.

18 Claims, 9 Drawing Sheets

(51) Int. Cl.
| | |
|---|---|
| *H02K 5/20* | (2006.01) |
| *F28D 7/00* | (2006.01) |
| *F28F 1/00* | (2006.01) |
| *F28F 1/10* | (2006.01) |
| *F28F 13/06* | (2006.01) |
| *F28F 13/08* | (2006.01) |
| *H01L 23/367* | (2006.01) |
| *H01L 23/467* | (2006.01) |

(52) U.S. Cl.
CPC ............... *F28F 1/006* (2013.01); *F28F 1/10* (2013.01); *F28F 13/06* (2013.01); *F28F 13/08* (2013.01); *H01L 23/367* (2013.01); *H01L 23/467* (2013.01)

(58) Field of Classification Search
CPC ......... F28D 7/00; H01L 23/36; H01L 23/367; H01L 23/467; H01L 23/4037
USPC ................................. 165/185, 80.3, 104.33
See application file for complete search history.

(56) References Cited

U.S. PATENT DOCUMENTS

| | | | |
|---|---|---|---|
| 8,654,529 B2* | 2/2014 | Attlesey | F28D 1/0206 165/80.4 |
| 2007/0284091 A1* | 12/2007 | Ghosh | G06F 1/20 257/E23.099 |
| 2010/0060130 A1* | 3/2010 | Li | F21K 9/23 313/46 |
| 2012/0033381 A1 | 2/2012 | Matsumoto et al. | |
| 2012/0069586 A1 | 3/2012 | Miyazaki | |
| 2013/0228914 A1 | 9/2013 | Di Stefano | |
| 2014/0299115 A1* | 10/2014 | Zhang | F28D 21/0003 123/568.12 |
| 2015/0085442 A1 | 3/2015 | Kondo et al. | |
| 2015/0109735 A1 | 4/2015 | Campbell et al. | |
| 2015/0163960 A1 | 6/2015 | Degner et al. | |
| 2015/0296659 A1* | 10/2015 | Desiano | H05K 7/20272 165/80.4 |

FOREIGN PATENT DOCUMENTS

| | | |
|---|---|---|
| JP | 03129896 A | 6/1991 |
| JP | 08250627 A | 9/1996 |
| JP | 09307040 A | 11/1997 |
| JP | 10275883 A | 10/1998 |
| JP | 2001284513 A | 10/2001 |
| JP | 2002111263 A | 4/2002 |
| JP | 2002124123 A | 4/2002 |
| JP | 2003069267 A | 3/2003 |
| JP | 2005-079337 A | 3/2005 |
| JP | 2006100410 A | 4/2006 |
| JP | 2007281163 A | 10/2007 |
| JP | 2008-235572 A | 10/2008 |
| JP | 2009129642 A | 6/2009 |
| JP | 2010274256 A | 12/2010 |
| JP | 2012049453 A | 3/2012 |
| JP | 2014036050 A | 2/2014 |
| JP | 2016517184 A | 6/2016 |
| TW | 201411322 A | 3/2014 |
| WO | 2010150366 A1 | 12/2010 |
| WO | 2015176992 A1 | 11/2015 |

OTHER PUBLICATIONS

International Search Report in the international application No. PCT/JP2018/010409, dated May 29, 2018.
Written Opinion of the International Searching Authority in the international application No. PCT/JP2018/010409, dated May 29, 2018 with English translation provided by Google Translate.
International Preliminary Report on Patentability Chapter II in the international application No. PCT/JP2018/010409.
Extended European Search Report from EP app. No. 18772334.1, dated Oct. 19, 2020.
First Office Action for Indian Patent Application 201947041688 issued by the Indian Patent Office dated Jun. 10, 2022.
Office action from Chinese Patent Application No. 201880019822.0 dated Mar. 21, 2023, with machine English translation made with Google Translate.
Office Action from corresponding Chinese Patent Application No. 201880019822.0 dated Oct. 14, 2023 with machine English translation by Google Translate.
Office action from Chinese Patent Application No. 201880019822.0 dated Oct. 10, 2022 with search report, and its translation using Microsoft Word.

* cited by examiner (a)

(b)

COOLING STRUCTURAL BODY, COOLING SYSTEM, HEAT GENERATOR AND CONSTRUCTION

CROSS-REFERENCE TO RELATED APPLICATIONS

The present application is the U.S. national phase of PCT Application PCT/JP2018/010409 filed on Mar. 16, 2018, which claims priority to Japanese Patent Application No. 2017-055419 filed on Mar. 22, 2017 and Japanese Patent Application No. 2017-234068 filed on Dec. 6, 2017, the disclosures of which are incorporated herein by reference in their entireties.

TECHNICAL FIELD

The present invention relates to a cooling structural body, a cooling system, a heat generator, and a construction.

BACKGROUND ART

Recently, in an electronic component such as an integrated circuit device in electronic equipment or the like, large-sizing, imparting a high function, high packing density and the like have been in progress. Along with such a progress, there is a tendency that a heat generation amount during an operation (in use) is increased. In addition, recently, there has been observed the vigorous development of a technique which requires a high-voltage large current such as an electric vehicle, a robot or a regenerative energy generator. In view of the above, a cooling structure for cooling an electronic component is requested to satisfy further enhancement of a cooling effect.

Under such a background, with respect to a cooling structure of an electronic component, for example, there has been a configuration where heat generated in an integrated circuit device mounted on a circuit board is transferred to a heat sink provided on a surface of the circuit board opposite to a mounting surface of the circuit board on which the integrated circuit device is mounted through a heat radiation via (through hole) formed in the circuit board, and heat is radiated by the heat sink (for example, see Patent Literature 1).

CITATION LIST

Patent Literature

Patent Literature 1: JP 10-275883 A

SUMMARY OF INVENTION

Technical Problem

However, in the above-mentioned cooling structure having the conventional configuration, to cope with the increase of a heat generation amount in recent years, there is no way but to adopt large-sizing of a heat sink or the increase of forced cooling power proportional to such increase of a heat generation amount. Accordingly, large-sizing of the cooling structure becomes necessary. Such a situation contradicts with a guideline for development of technology such as high packing density, reduction of weight, reduction of thickness, reduction of length and the like which are considered critically important in a recent electronic device industry.

It is an object of the present invention to provide a cooling structural body, a cooling system, a heat generator and a construction which can enhance a cooling effect compared to a conventional structure, and can easily realize a process of achieving the miniaturization of the cooling structure.

Solution to Problem

According to an aspect of the present invention, there is provided a medium flow path which includes a heat radiating part having a mounting surface on which an electronic component is directly or indirectly mounted, and through which a medium flows in the heat radiating part.

Advantageous Effects of Invention

According to the present invention, it is possible to provide a cooling structure of an electronic component which can enhance a cooling effect compared to a conventional structure. Accordingly, the cooling structure can easily realize a process of achieving the miniaturization of the cooling structure and the like.

DESCRIPTION OF EMBODIMENTS

Hereinafter, embodiments of the present invention are described with reference to drawings.

1. First Embodiment of the Present Invention

First, the first embodiment of the present invention is described.

(1-i) Configuration of Cooling Structure of Electronic Component

Figure 1:
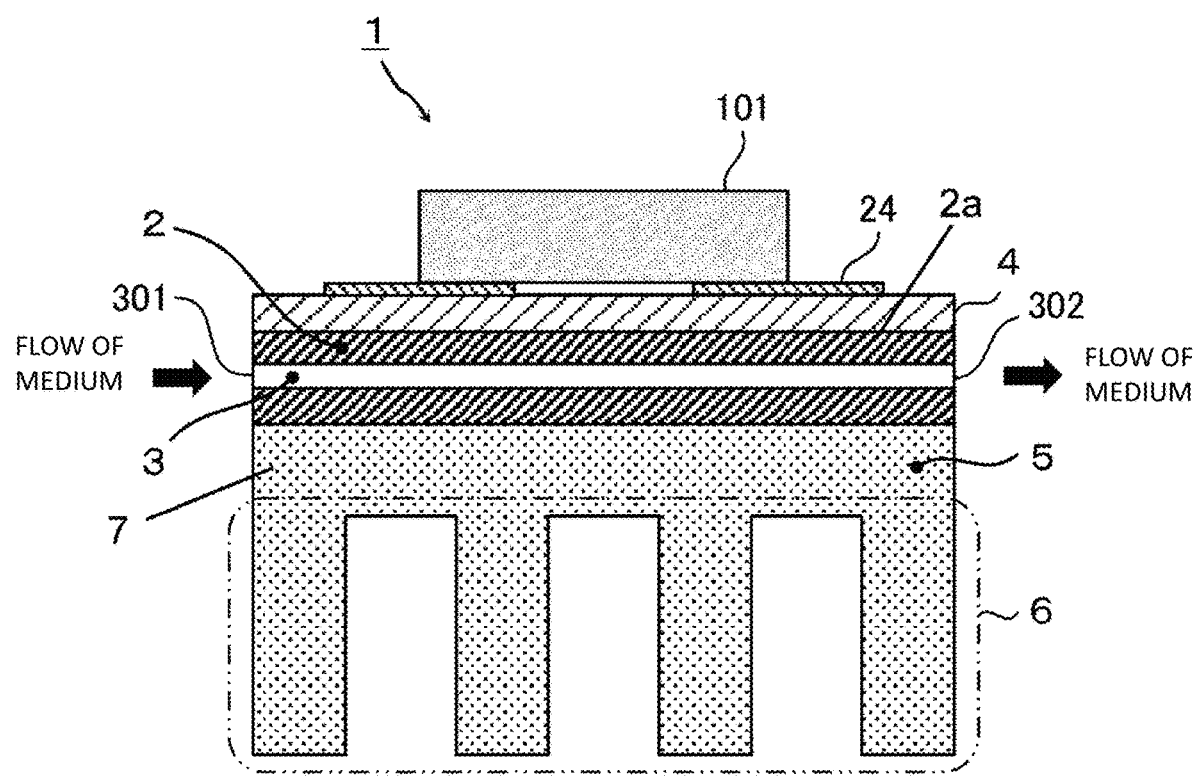
FIG. 1 is an explanatory view schematically showing a schematic configuration example of a cooling structure of an electronic component according to a first embodiment of the present invention.

FIG. 1 is an explanatory view schematically showing an overall configuration example of a cooling structure of an electronic component according to the first embodiment of the present invention. The example shown in the drawing schematically shows the overall configuration example of the cooling structure, and sizes and scales of the constitutional elements shown in the example are not always in accordance with actual sizes and scales.

(Entire Configuration)

The cooling structural body of this embodiment includes a heat radiating part having a mounting surface on which an electronic component 101 is directly or indirectly mounted. "directly" "mounted" means a state where the electronic component 101 is mounted on the mounting surface without interposing any constitutional element therebetween, and "indirectly mounted" means a state where a kind of member is interposed between the electronic component 101 and mounting surface. Further, the electronic component 101 may be indirectly mounted on the mounting surface while interposing an insulation substrate 4, a heat radiation insulation sheet and the like therebetween, or may be directly mounted on the mounting surface. The heat radiating part of the cooling structural body may have a heat sink 5 which is a heat radiation member described later and/or a heat conduction plate 2 as a heat conductive member. The heat radiation member may have a heat radiating body part 7, and heat radiation fins 6 which are provided on the heat radiating body part 7 as one example of the heat radiation structural part. The heat radiating body part 7 and the heat radiation structural part may be formed as an integral part. The heat radiation member may not include the heat radiation structural part. For example, the heat radiation member may be formed of a heat radiation block, for example.

The cooling structure 1 described later is a concept including the insulation substrate 4 besides the cooling structural body. As the heat conduction plate 2, a heat discharge plate having high heat discharge property may be used, or a cooling plate having a cooling function may be used. The heat conductive member and the cooling structure 1 may be made of different materials, or may be made of the same material. As one example, first metal may be used as a material of the heat conductive member, and second metal may be used as a material of the cooling structural body. For example, a material containing copper may be used as a material of the heat conductive member, and a material containing aluminum may be used as a material of the cooling structural body. Further, metal may be used as a material of the heat conductive member, non-metal may be used as a material of the cooling structural body. For example, a material containing copper or aluminum may be used as the material of the heat conductive member, and a material containing ceramic may be used as the material of the cooling structural body.

As shown in FIG. 1, the cooling structure 1 of the electronic component according to the first embodiment includes: the insulation substrate 4 having one surface (an upper surface in FIG. 1) on which the electronic component 101 which forms a heat generator is mounted; the heat conduction plate 2 as a heat conductive member and is bonded to the other surface (a lower surface in FIG. 1) of the insulation substrate 4; and a heat sink 5 as a heat radiation member and is bonded to a lower surface of the heat conduction plate 2. That is, the cooling structure 1 described above is configured to include: the insulation substrate 4 on which the electronic component 101 is mounted; the heat sink 5 which is indirectly bonded to the insulation substrate 4 with the heat conduction plate 2 interposed between: and the heat conduction plate 2 which is interposed between the insulation substrate 4 and the heat sink 5. The heat conduction plate 2 has a mounting surface 2a on which the insulation substrate 4 is mounted. At least a part of the heat medium hole 3 which is a medium flow path (at least a part shown in FIG. 1) is disposed in an extending manner in a direction along the mounting surface 2a. In an aspect shown in FIG. 1, an in-plane direction of the insulation substrate 4 (a direction including a left-and-right direction and a front-and-back direction of a paper surface in FIG. 1) becomes an in-plane direction of the mounting surface 2a, and at least a part of the heat medium hole 3 extends along the in-plane direction of the mounting surface 2a. In this embodiment, "direction along the mounting surface 2a" includes not only a direction extending parallel to an extending direction of the mounting surface 2a but also a direction extending in an inclined manner with respect to the extending direction of the mounting surface 2a.

(Insulation Substrate)

The insulation substrate 4 is a plate-like member on which the electronic component 101 is mounted. On a surface of the insulation substrate 4, a circuit pattern 24 which forms an electric circuit is formed, and the electronic component 101 which is a heat generator is mounted on the circuit pattern 24.

As the electronic component 101 mounted on the insulation substrate 4, various kinds of electronic components are available. However, a kind of the electronic component 101 is not particularly limited provided that the electronic component 101 is a heat generator. For example, the electronic component 101 may be a semiconductor chip such as a light emitting diode or a power device, an integrated circuit device such as an MPU (CPU), a power source component such as a transistor or a capacitor and the like.

(Heat Sink)

The heat sink 5 functions as a heat radiation member for radiating heat from the electronic component 101. Accordingly, the heat sink 5 is made of a metal material having favorable heat conductivity, and has the heat radiation fins 6 as the heat radiation structural part for radiating heat transferred to the heat sink 5 on a side (a lower side in the drawing) opposite to a side where the electronic component 101 is disposed (that is, on a side of a bonding surface with the heat conduction plate 2).

(Heat Conduction Plate)

The heat conduction plate 2 is a plate-like member made of a material having thermal conductivity, and functions as a heat conductive member for transferring heat from the insulation substrate 4 to the heat sink 5. Accordingly, it is preferable that the heat conduction plate 2 be formed of a plate-like member made of metal having favorable heat conductivity.

It is not always necessary for the heat conduction plate 2 to be formed of a single plate-like member, and the heat conduction plate 2 may have a multi-layered structure where a plurality of layers are stacked to each other, for example. To be more specific, the heat conduction plate 2 may include: a plate member which forms an intermediate layer as viewed in a side view; and metal layers which are provided so as to cover an upper surface and a lower surface of the plate member. In this case, for example, the plate member may be made of copper, a copper alloy, aluminum, an aluminum alloy or the like, and the metal layer may be formed of a plating layer made of copper or the like, for example. The heat conduction plate 2 may be formed by adhering an insulation resin and a copper foil to one surface side or both surface sides of the plate member.

The material of the heat conduction plate 2 is not always limited to a metal material. Provided that the heat conduction plate 2 is made of a material having favorable heat conductivity, the heat conduction plate 2 may be made of a non-metal material such as ceramic.

Further, a thin rust preventive film which does not deteriorate heat conductivity of gold plating or the like may be formed on the surface of the heat conduction plate 2, an inner wall surface of the heat medium hole 3 described later or the like for preventing oxidization corrosion of the surfaces.

In such a heat conduction plate 2, as described in detail later, an area directly below a part of the insulation substrate 4 where the electronic component 101 is mounted and an area in the vicinity of the area directly below the part of the insulation substrate 4 (that is, an area in the vicinity of the area directly below the part of the insulation substrate 4 where the electronic component is mounted including the area directly below the part of the insulation substrate 4) are defined as a mounting scheduled region 25 of the heat conduction plate 2 where the electronic component 101 is scheduled to be mounted (for example, see FIG. 2 described later). The number and a shape of the mounting scheduled regions 25 are suitably set corresponding to the specification and the like, and are not particularly limited.

(Heat Medium Hole)

In the heat conduction plate 2, the heat medium hole 3 which is in a through hole shape and extends in a predetermined direction is provided. The heat medium hole 3 is formed for performing heat dissipation (cooling) of the heat conduction plate 2 making use of convection of a medium such as a gas (for example, air) or a liquid such as water or oil which passes through the heat medium hole 3. That is, the heat medium hole 3 is configured to perform heat exhaustion due to the flow of a medium in the hole. The heat medium hole 3 which forms the medium flow path is provided in the heat conduction plate 2 and hence, the heat medium hole 3 is disposed between the insulation substrate 4 and the heat radiation fins 6 of the heat sink 5.

The heat medium hole 3 includes: a first opening part 301 through which a medium such as a gas or a liquid flows into the heat medium hole 3; and a second opening part 302 through which the medium is discharged from the heat medium hole 3. The first opening part 301 and the second opening part 302 are provided so as to be exposed on end surfaces of the heat conduction plate 2. With such a configuration, the heat medium hole 3 is formed in a through hole shape which extends from an inlet part disposed on one end surface of the heat conduction plate 2 and reaches an outlet part disposed on the other end surface of the heat conduction plate 2.

Such a heat medium hole 3 can be formed by applying machining, etching or the like to the heat conduction plate 2. For example, in a case where the heat conduction plate 2 has the multi-layered structure where a plate member and a metal layer are stacked to each other, the heat medium hole 3 can be easily formed in such a manner that a groove-shaped recessed part which opens toward one surface side of the plate member (a side where the insulation substrate 4 is bonded or a side opposite to the side) is provided and the metal layer is provided so as to close the opening part of the recessed part. In this case, the metal layer forms one example of a lid member which closes the recessed part. However, a method for forming the heat medium hole 3 is not particularly limited. Provided that the heat medium hole 3 is formed in a through hole shape, the heat medium hole 3 may be formed by using any technique.

With respect to the heat medium hole 3 which forms the medium flow path, at least a part (a part or all) of the heat medium hole 3 is formed so as to pass the mounting scheduled region 25 of the heat conduction plate 2 where the electronic component 101 is scheduled to be mounted (for example, see FIG. 2 described later). That is, the heat medium hole 3 is disposed such that at least a part of the heat medium hole 3 overlaps with an area in the vicinity of a part where the electronic component 101 is mounted as viewed in a plan view.

In this embodiment, the description is made by estimating the case where one heat medium hole 3 is provided in one mounting scheduled region 25 of the heat conduction plate 2. However, the number of heat medium holes 3 and the number of mounting scheduled regions 25 in the heat conduction plate 2 are not particularly limited. For example, a plurality of the mounting scheduled regions 25 and a plurality of the heat medium holes 3 may be provided to the heat medium holes 2.

Further, the present invention is not limited to the configuration where one heat medium hole 3 overlaps with one mounting scheduled region 25. For example, the configuration may be adopted where a plurality of the mounting scheduled areas 25 are provided to the heat conduction plate 2, and the heat medium hole 3 is provided so as to overlap with some of the plurality of mounting scheduled regions 25. Further, the configuration may be adopted where a plurality of the heat medium holes 3 are provided so as to overlap with one mounting scheduled region 25.

(1-ii) Extending Direction of Heat Medium Hole

Next, the arrangement of the heat medium hole at the time of using the cooling structure 1 of the electronic component having the above-mentioned configuration, and, particularly, the extending direction of the heat medium hole 3 at the time of using the cooling structure 1 are described specifically.

In this embodiment, the case is exemplified where a convection of a medium in the heat medium hole 3 is not generated forcibly, but the convection is generated by natural convection.

Figure 2:
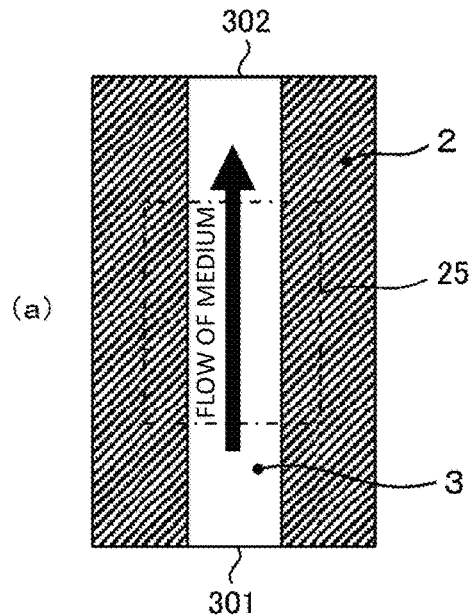
FIG. 2 is an explanatory view showing a configuration example of a heat medium hole in a cooling structure of the electronic component according to the first embodiment of the present invention, wherein FIG. 2(*a*) is a view showing one example of the configuration of the heat medium hole, FIG. 2(*b*) is a view showing another example of the configuration of the heat medium hole, FIG. 2(*c*) is a view showing further another example of the configuration of the heat medium hole, and FIG. 2(*d*) is a view showing still further another example of the configuration of the heat medium hole.
Figure 2:
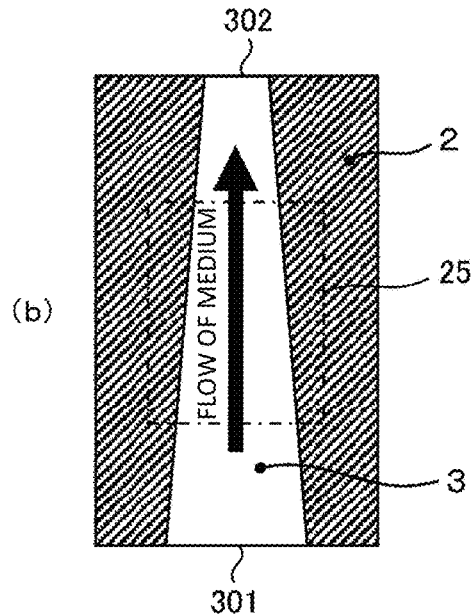
Figure 2:
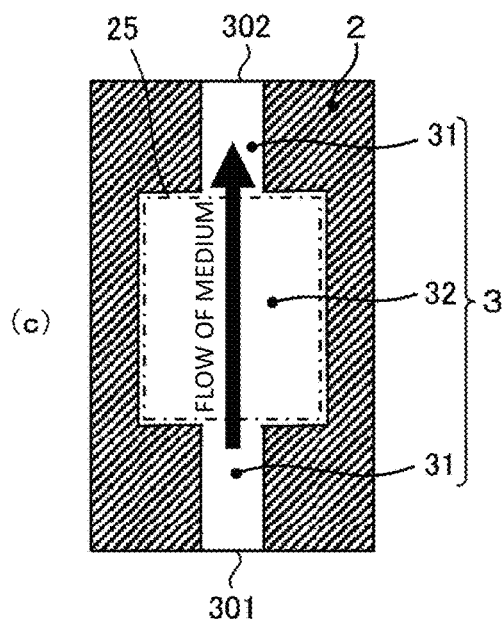
Figure 2:
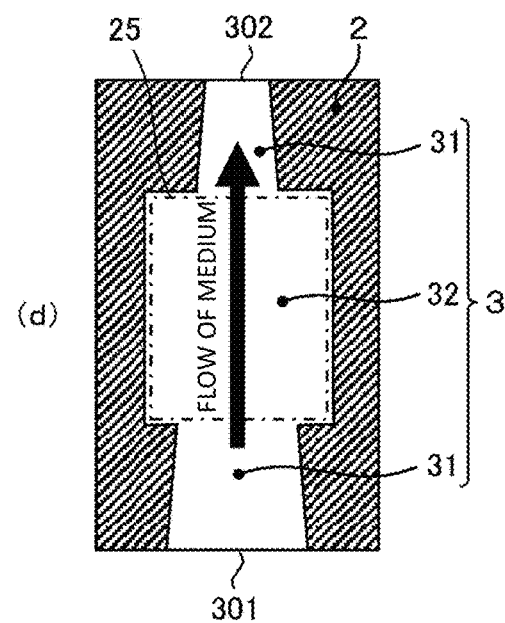

FIG. 2 is an explanatory view showing constitutional examples of the heat medium hole in the cooling structure of the electronic component according to the first embodiment of the present invention.

As shown in FIG. 2(*a*), the extending direction of the heat medium hole 3 may be directed along a vertical direction (gravity direction) at the time of using the cooling structure 1 of the electronic component. In this case, the first opening part 301 which is the inlet part for the medium is disposed on a surface on a lower side in the vertical direction, and the second opening part 302 which is the outlet part for the medium is disposed on a surface on an upper side in the vertical direction. Accordingly, as described later, the flow of the medium in the heat medium hole 3 can be generated by making use of heat convection (natural convection) attributed to chimney effect (draft effect), for example.

Such an extending direction of the heat medium hole 3 can be realized by disposing the whole cooling structure 1 as described above (by disposing the cooling structure 1 shown in FIG. 1 in a state where the cooling structure 1 is rotated in a left direction by 90 degrees). The cooling structure 1 may be disposed in a state where the extending direction of the heat medium hole 3 is inclined with respect to the horizontal direction at the time of using the cooling structure 1 of the electronic component. What is important is that, it is sufficient that, at the time of using the electronic component 101, the first opening part 301 which forms the inlet part for the medium to the heat medium hole 3 which is provided in one surface of the heat conduction plate 2 is disposed below the second opening part 302 which forms the outlet part for the medium from the heat medium hole 3 in a gravity direction (vertical direction) so that the first opening part 301 and the second opening part 302 differs from each other in height in a gravity direction.

The heat medium hole 3 may be formed such that at least a part of the heat medium hole 3 passes the mounting scheduled region 25 of the heat conduction plate 2 of the electronic component 101 as viewed in a direction perpendicular to the upper surface of the heat conduction plate 2 (hereinafter referred to as "normal direction view"). That is, the heat medium hole 3 may be disposed such that at least a part of the heat medium hole 3 overlaps with the mounting scheduled region 25 of the electronic component 101 as viewed in a normal direction.

With respect to a cross-sectional shape of the heat medium hole 3 (a cross-sectional shape when a cross section of the heat medium hole 3 is taken along a plane parallel to the extending direction of the heat medium hole 3), the heat medium hole 3 is formed so as to have a uniform cross-sectional size from the first opening part 301 to the second opening part 302. Accordingly, the heat medium hole 3 can be easily formed so that it is possible to prevent the configuration of the cooling structure 1 from becoming complicated and it is also possible to prevent the increase of a cost of the cooling structure 1. However, the heat medium hole 3 is not limited to the above-mentioned configuration, and may have the following cross-sectional shape.

As described above, it is sufficient for the heat medium hole 3 to have the configuration having the following technical characteristics.

(1) The heat medium hole 3 is formed in a through hole shape aiming at the heat radiation (heat dissipation) using the flow of the medium in the heat medium hole 3. For this end, the heat medium hole 3 extends in a predetermined extending direction, and makes the first opening part 301 as the medium inlet part provided on one surface of the heat conduction plate 2 and the second opening part 302 as the medium outlet part communicate with each other.

(2) As viewed in a normal direction, at least a part of the heat medium hole 3 overlaps with at least a part of the mounting scheduled region 25 for the electronic component 101 mounted on the insulation substrate 4.

(3) At the time of using the electronic component 101, the heat medium hole 3 extends in the vertical direction (gravity direction) (extending in at least a direction which is not the horizontal direction).

(1-iii) Flow of Heat and Medium

Next, the flow of heat and the medium in the cooling structure 1 of the electronic component having the above-mentioned configuration is described specifically.

In the cooling structure 1 of the electronic component having the above-mentioned configuration, heat which the electronic component 101 generates is transferred to the heat sink 5 as the heat radiation member through the insulation substrate 4 and the heat conduction plate 2, and the heat is radiated from the heat radiation fins 6 as the heat radiation structural part of the heat sink 5.

Here, during the heat radiation process, heat from the electronic component 101 is transferred also to the inside of the heat medium hole 3 in the heat conduction plate 2 so that the medium in the hole (a gas such as air or a liquid, for example) is heated. Accordingly, the medium in the heat medium hole 3 is heated so that a temperature of the medium is increased and the medium is expanded. Then, the medium rises in the heat medium hole 3 and flows out to the outside of the heat conduction plate 2 from the second opening part 302 (the opening part positioned on an upper side) by elevating the inside of the heat medium hole 3. Then, a fresh medium (for example, outside air) is sucked into the heat medium hole 3 from the first opening part 301 of the heat medium hole 3 (the opening part positioned on a lower side). In this manner, when heat from the electronic component 101 is transferred to the medium, a heat convection occurs in the heat medium hole 3. To be more specific, in the case where the medium is a gas, the flow of the medium from a lower side toward an upper side occurs due to a chimney effect (draft effect).

Accordingly, during a process where heat from the electronic component 101 is transferred to the heat sink 5 through the heat conduction plate 2, the heat medium hole 3 having a through hole shape is provided in the heat conduction plate 2 and hence, the heat from the electronic component 101 is discharged also by the flow of the medium in the heat medium hole 3. That is, with respect to heat from the electronic component 101, firstly, "substantially most of heat" is discharged by the flow of the medium in the heat medium hole 3 and, then, "residual heat" transferred to the heat radiation fins 6 of the heat sink 5 is radiated by the heat radiation fins 6.

As described above, according to the cooling structure 1 of the electronic component having the above-mentioned configuration, the heat is discharged not only by the heat radiation fins 6 of the heat sink 5 but also by the flow of the medium in the heat medium hole 3 and hence, a cooling effect applied to the heat from the electronic component 101 can be enhanced compared to the conventional configuration. Further, it is sufficient for the heat radiation fins 6 of the heat sink 5 to radiate "residual heat" after the radiation of heat is performed by the flow of the medium in the heat medium hole 3 and hence, it is possible to suppress large-sizing or the like of the cooling structure 1 for increasing a cooling performance. As a result, it is possible to easily take measures to realize small-sizing or the like of the cooling structure 1.

The heat medium hole 3 which plays the role of discharging "substantially most of heat" is configured such that the first opening part 301 which forms the medium inlet part is disposed below the second opening part 302 which forms the medium outlet part so that the flow of the medium in the heat medium hole 3 is generated by the heat convection of the medium attributed to a chimney effect (draft effect) or the like. Accordingly, when heat is transferred to the inside of the heat medium hole 3, due to the heat convection which is naturally generated and attributed to a change in density of the medium caused by heating of the medium, it is possible to generate the flow of the medium with certainty. That is, the discharging of heat can be performed with certainty by making use of the heat convection (natural convection). Accordingly, the above-mentioned configuration is extremely favorable for enhancing the cooling effect. Further, by making use of the natural convection, it is possible to prevent the cooling structure 1 from becoming complicated and hence, it is preferable for taking a measure to realize downsizing or the like of the cooling structure 1.

The heat medium hole 3 is disposed such that at least a part of the heat medium hole 3 overlaps with the mounting scheduled region 25 for the electronic component 101, and passes the area in the vicinity of the mounting part of the electronic component 101. In this manner, by allowing the heat medium hole 3 pass the area in the vicinity of the electronic component 101, in a state where the difference in temperature is large between a medium flowing in the heat medium hole 3 and the electronic component 101, heat from the electronic component 101 can be efficiently transferred to the medium and hence, it is possible to enhance the heat discharging efficiency by the medium (that is, cooling effect for cooling heat from the electronic component 101).

Further, the heat medium hole 3 is formed in the heat conduction plate 2 which is interposed between the insulation substrate 4 and the heat sink 5. That is, the heat medium hole 3 is formed in the heat conduction plate 2 which is a member provided separately from the insulation substrate 4 and the heat sink 5. Accordingly, it is possible to easily ensure a sufficient degree of freedom in settings of a route, a shape and the like of the heat medium hole 3 and hence, the present invention is favorable for ensuring general-use property and the like of the cooling structure 1.

(1-iv) Modification

Here, other constitutional examples of the heat medium hole 3 of this embodiment are described.

In the above-mentioned constitutional example, the description is made by taking the case where the cross-sectional shape of the heat medium hole 3 is uniform from the first opening part 301 to the second opening part 302 as an example (see FIG. 2(a)). However, the present invention is not limited to such a configuration.

For example, in the constitutional example shown in FIG. 2(b), with respect to the cross-sectional shape of the heat medium hole 3, a hole cross-sectional area of a first opening part 301 (in this constitutional example, a cross-sectional area of the first opening part 301 taken along a plane perpendicular to the extending direction of the heat medium hole 3. the same definition being applied to the description made hereinafter) is formed larger than a hole cross-sectional area of a second opening part 302 (a cross-sectional area of the second opening part 301 taken along a plane perpendicular to the extending direction of the heat medium hole 3. The same definition being applied to the description made hereinafter), and the whole heat medium hole 3 is formed in a tapered shape. The tapered hole shape may be realized by forming a first opening part 301 side larger than a second opening part 302 side in terms of a hole capacity which takes into account a predetermined size in the extending direction of the heat medium hole 3.

That is, the heat medium hole 3 shown in FIG. 2(b) has a part which is formed such that a hole cross-sectional area or a hole capacity on a medium inlet side in the hole of the heat medium hole 3 is larger than a hole cross-sectional area or a hole capacity on a medium outlet side in the hole. In this manner, by increasing an inlet-side hole cross-sectional area, a medium can be positively taken into the heat medium hole 3. On the other hand, by decreasing the hole cross-sectional area on an outlet side, a heat exchange between the heat conduction plate 2 and the medium taken into the hole can be accelerated. Accordingly, the heat medium hole 3 having the above-mentioned configuration is useful for enhancing heat discharging efficiency by the medium.

For example, in the configuration example shown in FIG. 2(c), with respect to a cross-sectional shape of the heat medium hole 3, the heat medium hole 3 includes small cross-sectional area parts 31 and a large cross-sectional area part 32 which differ from each other in cross-sectional area at the respective parts. To be more specific, the small cross-sectional area parts 31 are formed in each of a part in the vicinity of the first opening part 301 and a part in the vicinity of the second opening part 302, and the large cross-sectional area part 32 having the large cross-sectional area compared to the small cross-sectional area part 31 is provided at an intermediate part in the extending direction of the heat medium hole 3 from the small cross-sectional area part 31 disposed in the vicinity of the first opening part 301.

The large cross-sectional area part 32 is provided so as to overlap with a predetermined mounting scheduled region 25 as viewed in a normal direction. For example, it is considered that the large cross-sectional area part 32 is provided so as to cover the whole region of the predetermined mounting scheduled region 25. With such a configuration, the entirety of the electronic component 101 mounted on the mounting scheduled region 25 overlaps with the large cross-sectional area part 32. In this case, a size and a shape of the large cross-sectional area part 32 as viewed in a normal direction are set corresponding to a size and a shape of the mounting scheduled region 25 (in other words, a size and a shape of an element 101 mounted on the mounting scheduled region 25).

That is, the heat medium hole 3 shown in FIG. 2(c) is disposed so as to pass the mounting scheduled region 25 which is a region corresponding to the electronic component 101 and a non-mounting scheduled region other than the mounting scheduled region 25. At the same time, the heat medium hole 3 is formed such that a size of the hole cross-sectional shape of the large cross-sectional area part 32 which passes the mounting scheduled region 25 (specifically, a width or a height) is set larger than a size of the hole cross-sectional shape of the small cross-sectional area part 31 which passes the non-mounting scheduled region. In this manner, by increasing a size of the hole cross-sectional shape of the large cross-sectional area part 32 which passes the mounting scheduled region 25, it is possible to sufficiently ensure an effective area for transferring heat from the electronic component 101 to the medium in the inside of the heat medium hole 3. On the other hand, by decreasing a size of the hole cross-sectional shape of the small cross-sectional area part 31 which passes the non-mounting scheduled region, it is possible to suppress the decrease of heat capacity of the heat conduction plate 2 in which the heat medium hole 3 is formed. Accordingly, by making the mounting scheduled region and the non-mounting scheduled region different from each other in size of the hole cross-sectional shape, the heat medium hole 3 having such a configuration is useful for enhancing the heat discharging efficiency by the medium.

Further, a configuration example shown in FIG. 2(d) is a combination of the configuration example shown in FIG. 2(b) and the configuration example shown in FIG. 2(c). That is, with respect to a cross-sectional shape of the heat medium hole 3, the heat medium hole 3 includes the small cross-sectional area parts 31 and the large cross-sectional area part 32 which differ from each other in cross-sectional area at the respective parts, and two small area parts 31 are formed into a tapered shape. In other words, the large cross-sectional area part 32 which is a part directly below or in the vicinity of the electronic component 101 mounted on the insulation substrate 4 is formed to have a large size compared to other parts. Further, with respect to two small cross-sectional area parts 31, one small cross-sectional area part 31 which is a part on an opening part side where the medium is discharged is formed smaller than the other small cross-sectional area part 31 which is a part on an opening part side. With such a configuration, it is possible to acquire the manner of operation and the advantageous effects obtained by the configuration example shown in FIG. 2(b) and the manner of operation and the advantageous effects obtained by the configuration example shown in FIG. 2(c) in combination.

Figure 3:
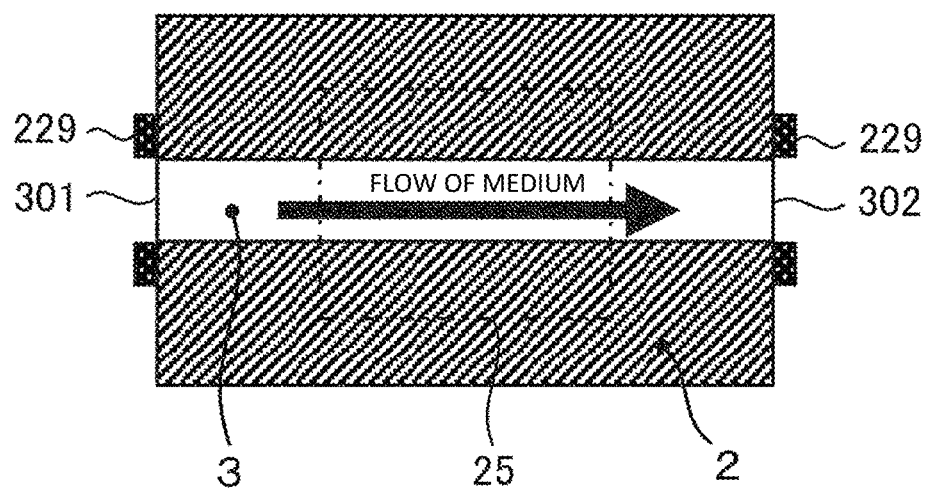
FIG. 3 is an explanatory view showing another configuration example relating to the heat medium hole in the cooling structure of the electronic component according to the first embodiment of the present invention.

FIG. 3 is an explanatory view showing another configuration example relating to the heat medium hole in the cooling structure of the electronic component according to the first embodiment of the present invention.

In the configuration example shown in FIG. 3, a heat insulating member 229 having favorable heat insulating property is mounted on a part in the vicinity of the first opening part 301 and a part in the vicinity of the second opening part 302. Specifically, the heat insulating member 229 is mounted on a surface of the heat conduction plate 2 so as to surround a periphery of the first opening part 301, and the heat insulating member 229 is mounted on a surface of the heat conduction plate 2 so as to surround a periphery of the second opening part 302. As the heat insulating member 229, the heat insulating member 229 made of, for example, a resin material such as silicon, heat insulating rubber or the like can be named. For example, the heat insulating member 229 may be formed by applying a material having high heat insulating property such as a heat insulating ink or the like. Further, for example, it is considered that the heat insulating member 229 is formed by using a fibrous heat insulating material represented by glass wool, a foamed heat insulating material represented by polystyrene foam or the like.

The heat insulating member 229 is disposed at each of the position in the vicinity of the first opening part 301 which is the medium inlet part of the heat medium hole 3 and the position in the vicinity of the second opening part 302 which is the medium outlet part of the heat medium hole 3. These heat insulating members 229 are disposed at the respective positions for the purpose of enhancing heat insulating property between an outside gas or an outside liquid which is an atmosphere around the first opening part 301 and second opening part 302 and the inside of the heat medium hole 3. In the vicinity of the first opening part 301, provided that the difference in temperature between the atmosphere around the heat medium hole 3 and the inside of the heat medium hole 3 can be increased, the natural convection easily occurs so that a suction force for sucking a heat medium into the heat medium hole 3 is increased and hence, the heat insulating members 229 are disposed for the purpose of preventing the increase of a temperature of the atmosphere by making heat minimally transferred to the surrounding atmosphere. On the other hand, in the vicinity of the second opening part 302, when the inside of the heat medium hole 3 is cooled by a cool medium around the heat medium hole 3, an effect of the heat convection is decreased and hence, the heat insulating member 229 is disposed for the purpose of preventing lowering of a temperature of the inside of the heat medium hole 3 caused by cooling from the outside of the hole.

Due to mounting of the heat insulating member 229, it is possible to enhance the heat insulating property between the atmosphere around the first opening part 301 or the second opening part 302 and the inside of the heat medium hole 3. Accordingly, it is possible to ensure the sufficient temperature difference between the atmosphere and the inside of the hole and hence, such a configuration is useful for enhancing a heat discharging efficiency by the medium. Particularly, when a chimney effect is utilized, a chimney effect can be enhanced and hence, such a configuration is extremely useful.

In this embodiment, the description is made with respect to a case where the heat insulating member 229 is disposed in each of a part in the vicinity of the first opening part 301 and a part in the vicinity of the second opening part 302 respectively. However, the present invention is not limited to such a configuration, and includes the case where the heat insulation is applied only to the first opening part 301 side and the case where the heat insulation is applied only to the second opening part 302 side. That is, even in the case where the heat insulation is provided between the inside and the outside of the heat medium hole 3, it is sufficient to mount the heat insulating members 229 having a heat insulating function in the vicinity of at least one of the first opening part 301 and the second opening part 302. By providing heat insulation to the respective parts, a heat insulation effect can be acquired at the respective parts. Accordingly, it is sufficient to perform heat insulating processing suitable for a target mode for carrying out the embodiment.

In this embodiment, the case is exemplified where the heat insulating members 229 are provided outside the heat medium hole 3 (that is, on the surface of the heat conduction plate 2). However, the present invention is not limited to such a case. The heat insulating member 229 may be provided inside the heat medium hole 3 at positions in the vicinity of the respective opening parts.

In this embodiment, the case is exemplified where the cross-sectional shape of the heat medium hole 3 is uniform in the same manner as the configuration example shown in FIG. 2(a). However, the present invention is not limited to such a case, and the present invention is also applicable to the heat medium holes 3 having the configuration examples shown in FIGS. 2(b) to 2(d) in the exactly same manner as the configuration example shown in FIG. 2(a).

Figure 4:
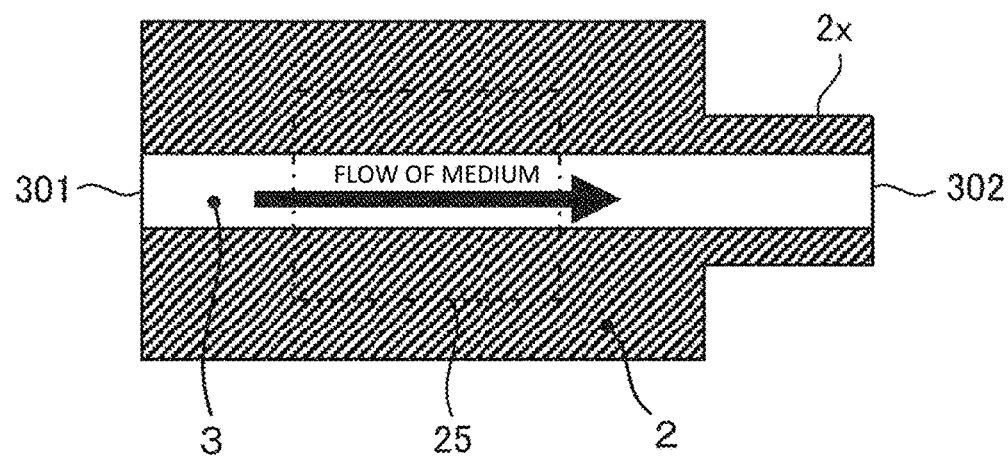
FIG. 4 is an explanatory view showing further another configuration example relating to the heat medium hole in the cooling structure of the electronic component according to the first embodiment of the present invention.

FIG. 4 is an explanatory view showing further another configuration example relating to the heat medium hole in the cooling structure of the electronic component according to the first embodiment of the present invention.

In the configuration example shown in FIG. 4, the heat conduction plate 2 is provided with a protruding part 2x which protrudes outward from one surface of the heat conduction plate 2 along the extending direction of the heat medium hole 3, and the heat medium hole 3 is disposed so as to penetrate the protruding part 2x. The second opening part 302 which forms the medium outlet part from the heat medium hole 2 is positioned at an end edge of the protruding part 2x. As in the case of the configuration example shown in FIG. 3, the heat insulating member 229 may be mounted in the vicinity of the second opening part 302.

In this manner, a necessary and sufficient protrusion length of the protruding part 2x can be ensured, and the second opening part 302 is positioned at the end edge of the protruding part 2x (that is, at the position away from the electronic component 101). With such a configuration, it is possible to suppress the occurrence of a phenomenon that the atmosphere around the second opening part 302 is adversely affected by heat from the electronic component 101. Accordingly, it is possible to ensure a sufficient temperature difference between the atmosphere and the inside of the heat medium hole 3 and hence, such a configuration is useful for enhancing the heat discharging efficiency by the medium. Particularly, in a case where a chimney effect is utilized, by suitably setting a protrusion length of the protruding part 2x or by applying heat insulation to the whole protruding part 2x, a chimney effect can be enhanced and hence, such a configuration is extremely useful.

In this embodiment, the case is exemplified where the protruding part 2x is provided on a medium outlet side of the heat medium hole 3, and the second opening part 302 is positioned at the end edge of the protruding part 2x. However, the present invention is not limited to such a case, and the embodiment includes the case where the protruding part 2x is provided on a medium inlet side of the heat medium hole 3, and the first opening part 301 is positioned at the end edge of the protruding part 2x. That is, it is sufficient that the protruding part 2x is provided on at least one of the medium inlet side and the medium outlet side of the heat medium hole 3. Also in this case, the heat insulation effect can be enhanced at respective parts and hence, such a configuration is useful for enhancing the heat discharging efficiency by the medium.

In this embodiment, the case is exemplified where the cross-sectional shape of the heat medium hole 3 is uniform in the same manner as the configuration example shown in FIG. 2(a). However, the present invention is not limited to such a case, and the present invention is also applicable to the heat medium hole 3 having the configuration examples shown in FIGS. 2(b) to 2(d) in the exactly same manner as the configuration example shown in FIG. 2(a).

(1-v) Advantageous Effects Acquired by this Embodiment

According to this embodiment, one or a plurality of advantageous effects described hereinafter can be acquired.

(a) According to this embodiment, heat which the electronic component 101 generates is transferred to the heat sink 5 through the insulation substrate 4 and the heat conduction plate 2, and is radiated by the heat radiation fins 6 of the heat sink 5. However, in the heat radiation process, the heat medium hole 3 is disposed in the heat conduction plate 2 and hence, the heat is discharged also by the flow of the medium in the heat medium hole 3. That is, with respect to heat from the electronic component 101, firstly, "substantially most of heat" is discharged by the flow of the medium in the heat medium hole 3 and, then, "residual heat" transferred to the heat radiation fins 6 of the heat sink 5 is radiated by the heat radiation fins 6. Accordingly, the heat is discharged not only by the heat radiation fins 6 of the heat sink 5 but also by the flow of the medium in the heat medium hole 3 and hence, a cooling effect for cooling heat from the electronic component 101 can be enhanced compared to the conventional structure. Further, it is sufficient for the heat radiation fins 6 of the heat sink 5 to radiate "residual heat" after discharging of heat by the flow of the medium in the heat medium hole 3 is performed and hence, it is possible to suppress large-sizing or the like of the cooling structure 1 for increasing a cooling performance. As a result, it is possible to easily satisfy a demand for small-sizing or the like of the cooling structure 1.

In other words, in the case of the conventional structure, for enhancing the cooling efficiency of the structure, generally, an amount of heat radiated from a surface side of the heat sink is increased by increasing a surface area, a volume or the like of the heat sink. On the other hand, in the cooling structure 1 of the electronic component according to this embodiment, the heat medium hole 3 is provided in the heat conduction plate 2 so that the cooling efficiency of the cooling structure 1 can be enhanced by increasing an amount of heat of a medium which absorbs heat from the inside of the cooling structure 1 in addition to heat radiation from the surface side of the cooling structure 1. In this manner, according to this embodiment, compared to the conventional cooling structure, the cooling performance of the whole cooling structure 1 is enhanced thus enhancing a cooling effect for cooling the electronic component 101. As a result, it is possible to provide the cooling structure 1 for a further miniaturized electronic component.

(b) The cooling structure 1 of the electronic component according to this embodiment is disposed such that at least a part of the heat medium hole 3 passes the region in the vicinity of the part where the electronic component 101 is mounted. In this manner, when the heat medium hole 3 passes the vicinity of the electronic component 101, heat transferred from the electronic component 101 can be efficiently transferred to the medium in a state where the difference in temperature between a medium flowing in the heat medium hole 3 and the electronic component 101 is large and hence, it is possible to enhance the heat discharging efficiency by the medium (that is, the cooling efficiency for cooling heat from the electronic component 101).

(c) The cooling structure 1 of the electronic component according to this embodiment is configured such that the heat conduction plate 2 is interposed between the insulation substrate 4 and the heat sink 5, and the heat medium hole 3 is formed in the heat conduction plate 2. In this manner, since the heat medium hole 3 is formed in the heat conduction plate 2 which is a member separate from the insulation substrate 4 and the heat sink 5, it is possible to easily ensure a sufficient degree of freedom in settings of a route, a shape or the like of the heat medium hole 3 and hence, the present invention is favorable for ensuring general-use property and the like of the cooling structure 1.

(d) The cooling structure 1 of the electronic component according to this embodiment is configured such that the first opening part 301 which forms the medium inlet part is disposed below the second opening part 302 which forms the medium outlet part, and the flow of the medium in the heat medium hole 3 is generated by the heat convection of the medium. Accordingly, when heat is transferred to the inside of the heat medium hole 3, due to the natural heat convection, it is possible to generate the flow of the medium with certainty. That is, the heat radiation can be performed with certainty by making use of the natural heat convection and hence, the cooling structure 1 is extremely favorable for enhancing the cooling effect. Further, by making use of the natural convection, it is possible to prevent the cooling structure 1 from becoming complicated and hence, it is preferable for taking a measure to realize downsizing or the like of the cooling structure 1.

(e) As described in this embodiment, the heat medium hole 3 has a part which is formed such that a hole cross-sectional area or a hole capacity on the medium inlet side in the heat medium hole 3 is set larger than a hole cross-sectional area or a hole capacity on the medium outlet side in the heat medium hole 3, and the heat medium hole 3 is entirely formed in a tapered shape. Such a configuration is useful for enhancing the heat radiation property by the medium. That is, a medium can be positively taken into the heat medium hole 3 by increasing the hole cross-sectional area or the hole capacity on the inlet side. On the other hand, a heat exchange between the heat conduction plate and the medium taken into the hole can be accelerated by decreasing the hole cross-sectional area or the hole capacity on the outlet side.

(f) As described in this embodiment, the heat medium hole 3 is disposed to pass the mounting scheduled region 25 which is a region corresponding to the electronic component 101 and the non-mounting scheduled region other than the mounting scheduled region 25, and is formed such that a size of the hole cross-sectional shape at the mounting scheduled region 25 is set larger than a size of the hole cross-sectional shape at the non-mounting scheduled region so that a size of the hole cross-sectional area differs between the mounting scheduled region 25 and the non-mounting scheduled region. Such a configuration is useful for enhancing the heat discharging efficiency by the medium. That is, by increasing a size of the hole cross-sectional shape of the large cross-sectional area part 32 which passes the mounting scheduled region 25, it is possible to ensure a sufficient effective area for transferring heat from the electronic component 101 to the inside of the heat medium hole 3. On the other hand, by decreasing a size of the hole cross-sectional shape of the small cross-sectional area part 31 which passes the non-mounting scheduled region, it is possible to suppress the decrease of heat capacity of the heat conduction plate 2 in which the heat medium hole 3 is formed.

(g) As described in this embodiment, the heat insulating member 229 having the heat insulating function is mounted in the vicinity of at least one of the first opening part 301 and the second opening part 302. With such a configuration, it is possible to enhance the heat insulating property between the atmosphere around the first opening part 301 or the second opening part 302 and the inside of the heat medium hole 3. Accordingly, it is possible to ensure the sufficient temperature difference between the atmosphere and the inside of the hole and hence, such a configuration is useful for enhancing a heat discharging efficiency by the medium. Particularly, when a chimney effect is utilized, a chimney effect can be enhanced and hence, such a configuration is extremely useful.

(h) As described in this embodiment, the protruding part 2x in which the heat medium hole 3 is provided in a penetrating manner is provided, and the first opening part 301 which forms the medium inlet part or the second opening part 302 which forms the medium outlet part is positioned at the end edge of the protruding part 2x. With such a configuration, it is possible to suppress the occurrence of a phenomenon that the atmosphere around the first opening part 301 or the second opening part 302 is adversely affected by heat from the electronic component 101. Accordingly, it is possible to ensure the sufficient temperature difference between the atmosphere and the inside of the heat medium hole 3 and hence, such a configuration is useful for enhancing the heat discharging efficiency by the medium. Particularly, in a case where a chimney effect is utilized, by suitably setting a protrusion length of the protruding part 2x or by applying heat insulation to the whole protruding part 2x, a chimney effect can be enhanced and hence, such a configuration is extremely useful.

2. Second Embodiment of the Present Invention

Next, the second embodiment of the present invention is described.

In the second embodiment, a point which makes the second embodiment different from the above-mentioned first embodiment is mainly described. That is, in the second embodiment, the constitutional elements substantially equal to the corresponding constitutional elements in the above-mentioned first embodiment are given the same symbols in the drawing, and the detailed explanation of these constitutional elements is omitted.

(2-i) Configuration of Cooling Structure of Electronic Component

Figure 5:
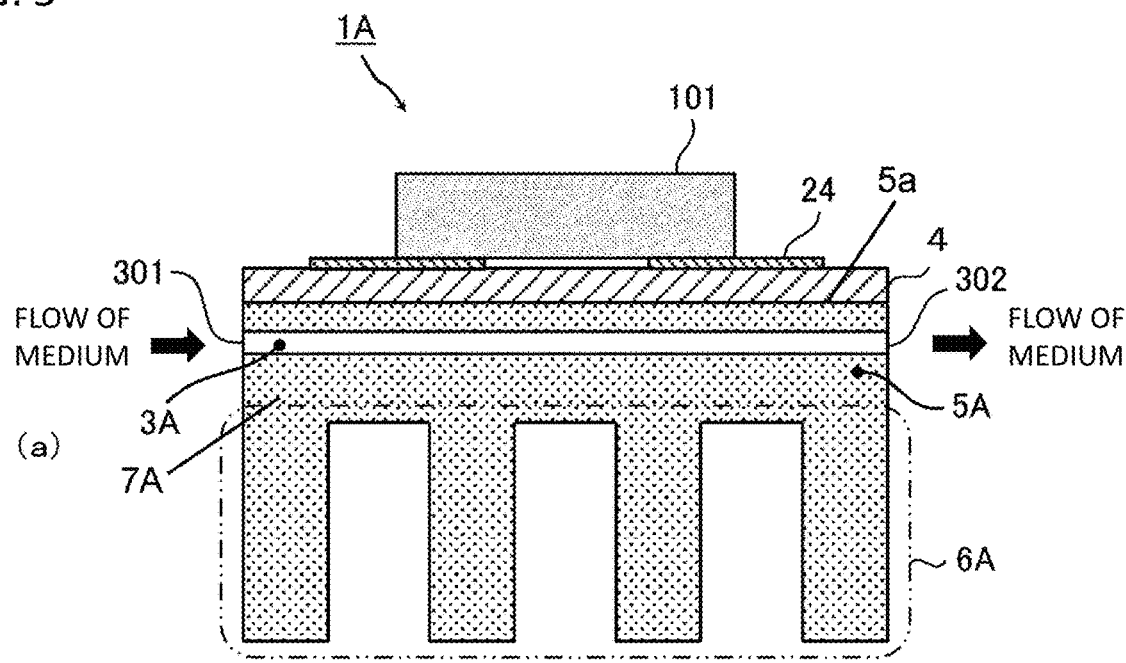
FIG. 5 is an explanatory view schematically showing a schematic configuration example of a cooling structure of an electronic component according to a second embodiment of the present invention, wherein FIG. 5(*a*) is a view showing one example of the schematic configuration of the cooling structure, and FIG. 5(*b*) is a view showing another example of the schematic configuration of the cooling structure.
Figure 5:
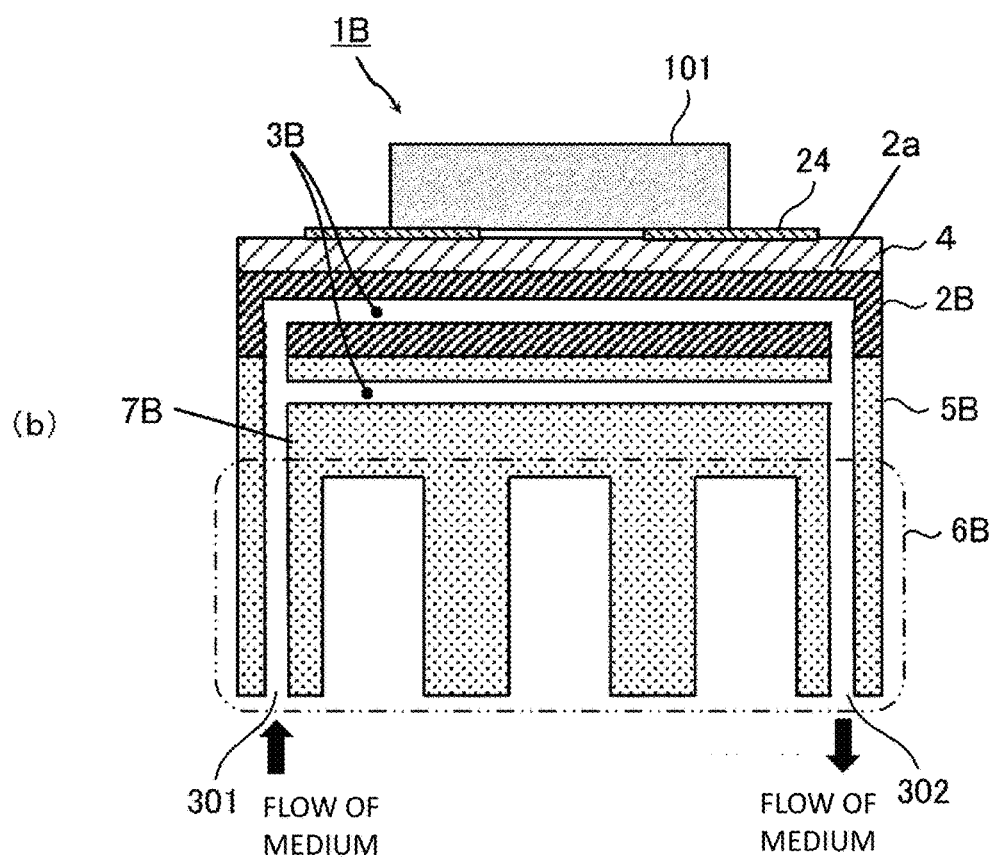

FIG. 5 is an explanatory view schematically showing an overall configuration example of a cooling structure of an electronic component according to the second embodiment of the present invention. The example shown in the drawing schematically shows the overall configuration example of the cooling structure, and sizes and scales of the constitutional elements shown in the example are not always in accordance with actual sizes and scales.

(Entire Configuration)

As shown in FIG. 5(a), although a cooling structure 1A of the electronic component according to the second embodiment has substantially the same configuration as the cooling structure of the first embodiment, the cooling structure 1A differs from the cooling structure of the first embodiment with respect to the following points. Unlike the first embodiment, the cooling structure 1A does not include a heat conduction plate 2. That is, the cooling structure 1A includes: an insulation substrate 4 having one surface on which an electronic component 101 which forms a heat generating body is mounted; and a heat sink 5A which is directly bonded to the other surface of the insulation substrate 4. In an aspect shown in FIG. 5(a), the heat sink 5A which is a heat radiation member has a mounting surface 5a on which an insulation substrate 4 is mounted. In the aspect shown in FIG. 5(a), the heat radiation member may have a heat radiating body part 7A, and fins 6A which are provided on the heat radiating body part 7A as one example of a heat radiation structural part.

(Heat Medium Hole)

The cooling structure 1A does not include the heat conduction plate 2. Accordingly, a heat medium hole 3A extending in a predetermined direction and having a through hole shape is provided in the heat sink 5A at a part in the vicinity of a bonding surface with the insulation substrate. That is, the heat medium hole 3A is disposed between the insulation substrate 4 and the heat radiation fins 6A of the heat sink 5A.

Substantially in the same manner as the case of the first embodiment, the heat medium hole 3A is configured such that the heat medium hole 3A is formed in a through hole shape through which the first opening part 301 and the second opening part 302 communicate with each other, and discharges heat due to the flow of a medium in the heat medium hole 3A.

That is, it is sufficient for the heat medium hole 3A to have the constitutional features described hereinafter.

(1) The heat medium hole 3A extends in the predetermined extending direction, makes the first opening part 301 as the medium inlet part provided on one surface of the heat sink 5A and the second opening part 302 as the medium outlet part communicate with each other. The heat medium hole 3A is provided for performing heat radiation (heat dissipation) using the flow of the medium in the heat medium hole 3A.

(2) As viewed in a normal direction, at least a part of the heat medium hole 3A overlaps with at least a part of the mounting scheduled region 25 for the electronic component 101 mounted on the insulation substrate 4.

(3) At the time of using the electronic component 101, the heat medium hole 3A extends in the vertical direction (gravity direction) (extending in at least a direction which is not the horizontal direction).

(2-ii) Flow of Heat and Medium

Also in the cooling structure 1A of the electronic component having the above-mentioned configuration, substantially in the same manner as the case of the first embodiment, heat which the electronic component 101 generates is transferred to the heat sink 5A through the insulation substrate 4, and is radiated by the heat radiation fins 6A of the heat sink 5A. However, in the heat radiation process, the heat medium hole 3A is disposed in the heat sink 5A and hence, the heat is discharged also by the flow of the medium in the heat medium hole 3A. That is, with respect to heat from the electronic component 101, firstly, "substantially most of heat" is discharged by the flow of the medium in the heat medium hole 3A and, then, "residual heat" transferred to the heat radiation fins 6A of the heat sink 5A is radiated by the heat radiation fins 6A.

(2-iii) Advantageous Effects Acquired by this Embodiment

According to this embodiment, one or a plurality of advantageous effects described hereinafter can be acquired.

(a) In the cooling structure 1A of the electronic component according to this embodiment, heat is discharged not only by the heat radiation fins 6A of the heat sink 5A but also by the flow of the medium in the heat medium hole 3A formed in a region in the vicinity of the insulation substrate 4 in the heat sink 5A. Accordingly, it is possible to acquire substantially the same advantageous effects as the first embodiment.

(b) In the cooling structure 1A of the electronic component according to this embodiment, the heat sink 5A is directly bonded to the insulation substrate 4, and the heat medium hole 3A is formed in the region of the heat sink 5A in the vicinity of the insulation substrate 4. Accordingly, it becomes unnecessary to interpose the heat conduction plate 2 as a member separate from the heat sink 5A and the insulation substrate 4 between the heat sink 5A and the insulation substrate 4. Accordingly, it is possible to prevent the configuration of the cooling structure 1A from becoming complicated while acquiring the advantageous effect that the cooling effect of cooling the electronic component 101 can be enhanced.

(2-iv) Modification

In the above-mentioned embodiment, the case is exemplified where the heat medium hole 3A is formed in the heat sink 5A, and the heat conduction plate 2 which is a member separate from the heat sink 5A and the insulation substrate 4 is not interposed between the heat sink 5A and the insulation substrate 4 as an example. However, the present invention is not limited to such a configuration, such a configuration and the configuration described in the first embodiment may be adopted in combination.

Specifically, as shown in FIG. 5(*b*), a configuration may be adopted where, in a configuration where a heat conduction plate 2B is interposed between an insulation substrate 4 and a heat sink 5B, heat medium holes 3B are formed in each of the heat conduction plate 2B and the heat sink 5B, and the heat medium holes 3B are used in combination. Also in such a configuration example, it is possible to acquire substantially the same advantageous effects as in the case of the first embodiment. In an aspect shown in FIG. 5(*b*), the heat conduction plate 2B included in the heat radiating part has a mounting surface 5a on which the insulation substrate 4 is mounted. In the aspect shown in FIG. 5(*b*), the heat radiation member may have a heat radiating body part 7B, and fins 6B which are provided on the heat radiating body part 7B and which is one example of the heat radiation structural part.

3. Third Embodiment of the Present Invention

Next, the third embodiment of the present invention is described.

Also in the third embodiment, a point which makes the third embodiment different from the above-mentioned first embodiment is mainly described. That is, in the third embodiment, the constitutional elements substantially equal to the corresponding constitutional elements in the above-mentioned first embodiment are given the same symbols in the drawing, and the detailed description of the constitutional elements is omitted.

(3-i) Configuration of Cooling Structure of Electronic Component

Figure 6:
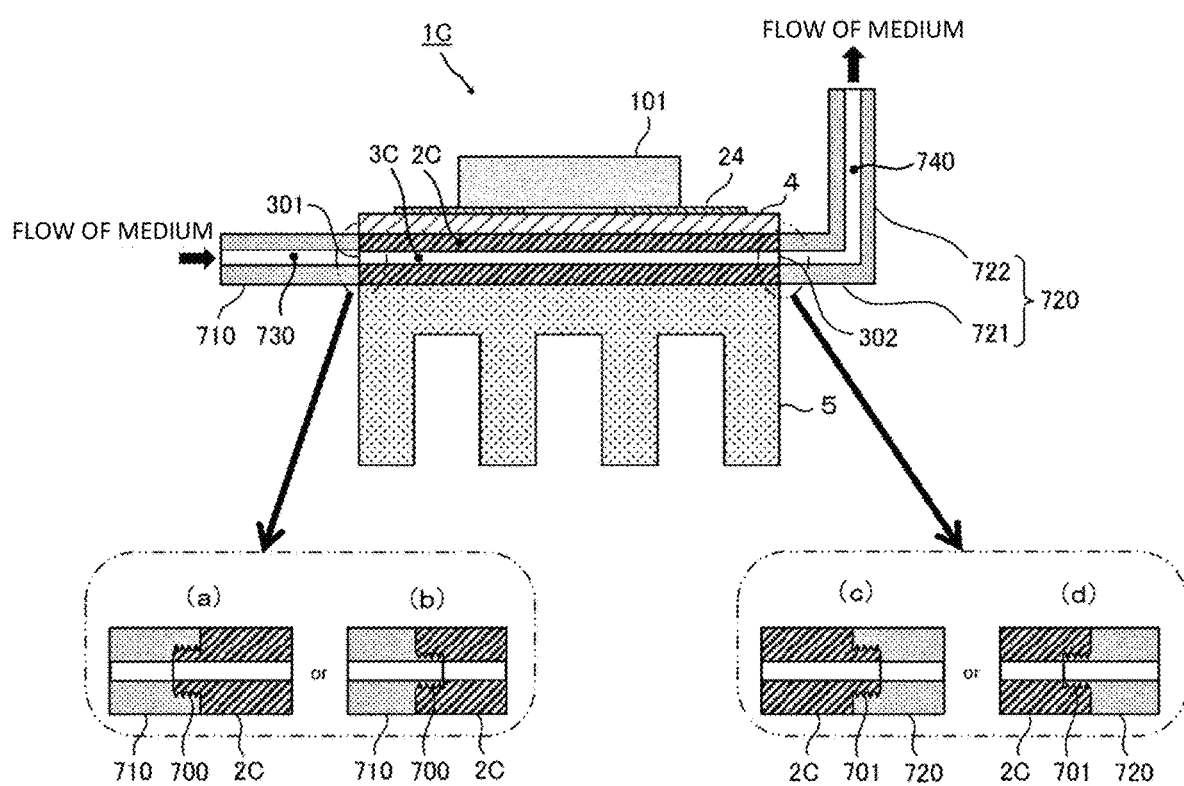
FIG. 6 is an explanatory view schematically showing a schematic configuration example of a cooling structure of an electronic component according to a third embodiment of the present invention.

FIG. 6 is an explanatory view schematically showing an overall configuration example of a cooling structure of an electronic component according to the third embodiment of the present invention. The example shown in the drawing schematically shows the overall configuration example of the cooling structure, and sizes and scales of the constitutional elements shown in the example are not always in accordance with actual sizes and scales.

(Entire Configuration)

As shown in FIG. 6, although a cooling structure 1C of the electronic component according to the third embodiment has substantially the same configuration as the cooling structure of the first embodiment, the cooling structure 1C differs from the cooling structure of the first embodiment with respect to the following points. The cooling structure 1C includes, in addition to the configuration described in the first embodiment, a first ventilation pipe 710 as a pipe member mounted on the first opening part 301, and a second ventilation pipe 720 as a chimney member mounted on the second opening part 302.

(First Ventilation Pipe)

The first ventilation pipe 710 functions as a cylindrical introducing pipe, and a through hole 730 is provided in the first ventilation pipe 710 along an axis of the first ventilation pipe 710. The first ventilation pipe 710 is mounted on a first joint 700 which is formed on the first opening part 301 of the heat conduction plate 2C. That is, the first ventilation pipe 710 is configured such that the first ventilation pipe 710 is connected to the first opening part 301 by way of a first joint 700 so as to extend the heat medium hole 3C in the heat conduction plate 2C due to the through hole 730 which the first ventilation pipe 710 has.

(Second Ventilation Pipe)

The second ventilation pipe 720 functions as a cylindrical exhaust pipe, and a through hole 740 is provided in the second ventilation pipe 720. The second ventilation pipe 720 is mounted on a second joint 701 which is formed on the second opening part 302 of the heat conduction plate 2C. That is, the second ventilation pipe 720 is configured such that the second ventilation pipe 720 is connected to the second opening part 302 by way of the second joint 701 so as to extend the heat medium hole 3C in the heat conduction plate 2C due to the through hole 740 which the second ventilation pipe 720 has.

In this embodiment, the second ventilation pipe 720 includes a body part 721, and a chimney part 722.

The body part 721 has a cylindrical shape, and a through hole 740 is provided in the body part 721 along an axis of the body part 721. The body part 721 is mounted on the second joint 701 which is formed on the second opening part 302 of the heat conduction plate 2C.

The chimney part 722 has a cylindrical shape, and a through hole 740 is provided in the chimney part 722 along an axis of the chimney part 722. One end part of the chimney part 722 is connected to an end part of the body part 721 on a side opposite to the heat conduction plate 2C side, and an opening part directed upward is provided on the other end part of the chimney part 722. An axis of the chimney part 722 extends along a direction orthogonal to an axial direction of the heat medium hole 3C in the heat conduction plate 2C, for example. However, it is not always necessary for the axis of the chimney part 722 to be orthogonal to the axial direction of the heat medium hole 3C, and the axis of the chimney part 722 may intersect with the axial direction of the heat medium hole 3C in an inclined manner.

The second ventilation pipe 720 which includes the body part 721 and the chimney part 722 is mounted on the second joint 701 of the heat conduction plate 2. In this case, the axial direction of the body part 721 and the axial direction of the chimney part 722 intersect with each other. Accordingly, an end part of the chimney part 722 on an opening part side (that is, an end part on a side where the chimney part 722 is not connected to the body part 721) is disposed at a position different from a position where the second joint 701 is formed in the vertical direction (a direction perpendicular to a surface of the heat conduction plate 2C). To be more specific, assuming one surface of the heat conduction plate 2C as a reference surface, the opening part of the second ventilation pipe 720 on a side opposite to the heat conduction plate 2C extends upward in the vertical direction from the reference surface, and is directed upward.

(First Joint, Second Joint)

The first joint 700 functions as a mounting part for mounting the first ventilation pipe 710 as a pipe member on the first opening part 301 of the heat conduction plate 2C. The second joint 701 functions as a mounting part for mounting the second ventilation pipe 720 as a chimney member on the second opening part 302 of the heat conduction plate 2C.

Both of the first joint 700 and the second joint 701 are formed integrally with the heat conduction plate 2C. Specifically, for example, with respect to the first joint 700 and the second joint 701, threading is applied to an outer peripheral side surface of a protruding part protruding from the heat conduction plate 2C thus forming a male threaded parts. In this case, a female threaded part which threadedly engages with the male threaded part is formed on each of the first ventilation pipe 710 and the second ventilation pipe 720. The present invention is not always limited to such a configuration. For example, with respect to the first joint 700 and the second joint 701, a female threaded part may be formed by applying threading to an inner peripheral side surface of a recessed part of the heat conduction plate 2C. In this case, a male threaded part which threadedly engages with the female threaded part is formed on each of the first ventilation pipe 710 and the second ventilation pipe 720.

With such a configuration, the first joint 700 and the second joint 701 enable mounting of the through hole 730 of the first ventilation pipe 710 and the through hole 740 of the second ventilation pipe 720 on the heat medium hole 3C of the heat conduction plate 2C with an air-tightness.

In this embodiment, the description is made by taking a configuration example where the male threaded part and the female threaded part threadedly engage with each other. However, the embodiment is not limited to the above-mentioned configuration, and provided that the mounting with an air-tightness is possible, a constitutional example of another aspect (for example, press-fitting engagement between a protruding part and a recessed part) may be also adopted.

(Heat Insulating Member)

It is preferable that the first joint 700 and the second joint 701 enable mounting of the first ventilation pipe 710 and the second ventilation pipe 720 in a state where heat insulating property is ensured. Specifically, for example, a heat insulating member having a heat insulating function (not shown in the drawing) be mounted on any one of surfaces or a plurality of surfaces out of an outer peripheral surface, an inner peripheral surface and an end surface of each of the first joint 700 and the second joint 701. As the heat insulating member, substantially the same insulating member used in the first embodiment may be used. With such a configuration, by enabling mounting of the heat insulating member in a state where the heat insulating member has a heat insulating property, it is possible to enhance a heat insulating property between the heat conduction plate 2C and the first ventilation pipe 710 or between the heat conduction plate 2C and the second ventilation pipe 720 (that is, between the inside of the heat medium hole 3C and the respective through holes 730, 740).

As described above, it is sufficient for the cooling structure 1C of this embodiment to include the following characteristics.

(1) The heat medium hole 3C extends in the predetermined extending direction. The first opening part 301 as the medium inlet part provided on one surface of the heat conduction plate 2 and the second opening part 302 as the medium outlet part communicate with each other so that the heat medium hole 3C has a through hole shape for discharging heat (heat dissipation) using the flow of the medium in the hole.

(2) As viewed in a normal direction, at least a part of the heat medium hole 3C overlaps with at least a part of the mounting scheduled region 25 for the electronic component 101 mounted on the insulation substrate 4.

(3) The second ventilation pipe 720 as the chimney member is mounted on the second opening part 302, and the heat medium hole 3C is extended by the through hole 740 of the second ventilation pipe 720. With such a configuration, the opening part of the through hole 740 is positioned above the second opening part 302 in the vertical direction (gravity direction).

(4) Preferably, the first ventilation pipe 710 as the pipe member is mounted on the first opening part 301, and the heat medium hole 3C is extended by the through hole 730 of the first ventilation pipe 710.

(5) Preferably, the first joint 700 and the second joint 701 which respectively form the mounting parts of the first ventilation pipe 710 and the second ventilation pipe 720 have the air-tightness and heat insulating property.

(3-ii) Flow of Heat and Medium

In the cooling structure 1C of the electronic component having the above-mentioned configuration, the heat medium hole 3C is extended by the through hole 740 of the second ventilation pipe 720 and hence, the opening part of the through hole 740 is positioned above the second opening part 302 in the vertical direction (gravity direction). Accordingly, at the time of using the electronic component 101, even when the electronic component 101 is disposed such that the heat medium hole 3C extends in a horizontal direction, the opening part of the through hole 730 of the first ventilation pipe 710 which forms the medium inlet part is disposed below the second opening part of the through hole 740 of the second ventilation pipe 720 which forms the medium outlet part and hence, the flow of the medium in the heat medium hole 3C is generated by the heat convection attributed to a chimney effect (draft effect) and the like. That is, irrespective of the arrangement mode of the electronic component 101 and the insulation substrate 4, it is possible to generate the flow of the medium using the natural convection in the heat medium hole 3C. When the flow of the medium is generated in the heat medium hole 3C, heat generated by the electronic component 101 is discharged substantially in the same manner as the case of the first embodiment.

In such a configuration, the heat medium hole 3C is extended by the through hole 730 of the first ventilation pipe 710. Accordingly, the opening part of the through hole 730 is disposed at the position away from the electronic component 101 and hence, it is possible to suppress the occurrence of a phenomenon that the atmosphere around the opening part of the through hole 730 is adversely affected by heat from the electronic component 101. Accordingly, it is possible to ensure a sufficient temperature difference between the atmosphere and the inside of the heat medium hole 3 and hence, such a configuration is useful for enhancing the heat discharging efficiency by the medium. Further, the heat discharging efficiency can be enhanced by mounting the first ventilation pipe 710 which is a member separate from the heat conduction plate 2C. Accordingly, a sufficient degree of freedom in arrangement can be ensured with respect to the heat medium hole 3C and the first opening part 301 on a side where the first ventilation pipe 710 is mounted.

By extending the heat medium hole 3C using the through hole 740 of the second ventilation pipe 720, substantially in the same manner as the case of the above-mentioned first ventilation pipe 710, it is possible to ensure a sufficient difference in temperature between the atmosphere around the opening part of the through hole 740 and the inside of the heat medium hole 3. Accordingly, particularly, it is possible to enhance a heat convection effect and hence, such a configuration is useful for enhancing a heat discharging efficiency by the medium. Further, a heat discharging efficiency can be enhanced by mounting the second ventilation pipe 720 which is a member separate from the heat conduction plate 2C and hence, a sufficient degree of freedom in arrangement can be ensured with respect to the heat medium hole 3C and the second opening part 302 on a side where the second ventilation pipe 720 is mounted.

These configurations are extremely useful provided that the first joint 700 and the second joint 701 have the air-tightness and the heat insulating property. Provided that the first joint 700 and the second joint 701 have an air-tightness, there is no possibility that leakage of the medium occurs at the first joint 700 or the second joint 701. Provided that the first joint 700 and the second joint 701 have a heat insulating property, heat from the electronic component 101 is insulated by the first joint 700 or the second joint 701 with certainty. Accordingly, it is possible to generate the flow of the medium in the heat medium hole 3C with certainty and hence, such a configuration is extremely useful for enhancing the heat discharging efficiency by the medium.

(3-iii) Advantageous Effects Acquired by this Embodiment

According to this embodiment, one or a plurality of advantageous effects described hereinafter can be acquired.

(a) In the cooling structure 1C of the electronic component according to this embodiment, discharging of heat is performed not only by the heat radiation fins 6 of the heat sink 5 but also by the flow of the medium in the heat medium hole 3C formed in the heat conduction plate 2C and hence, it is possible to acquire substantially the same advantageous effects as the first embodiment.

(b) In the cooling structure 1C of the electronic component according to this embodiment, the heat medium hole 3C is extended by the through hole 740 of the second ventilation pipe 720 which functions as a chimney member. With such a configuration, it is possible to ensure a sufficient difference in temperature between the atmosphere around the opening part of the through hole 740 and the inside of the heat medium hole 3. Accordingly, such a configuration is useful for enhancing the heat discharging efficiency by the medium. Particularly, when the natural convection attributed to a chimney effect is utilized, a chimney effect can be enhanced and hence, such a configuration is extremely useful.

Further, the heat discharging efficiency can be enhanced by mounting the second ventilation pipe 720 which is a member separate from the heat conduction plate 2C and hence, a sufficient degree of freedom in arrangement can be ensured with respect to the heat medium hole 3C and the second opening part 302 on a side where the second ventilation pipe 720 is mounted.

(c) In the cooling structure 1C of the electronic component according to this embodiment, the heat medium hole 3C is extended by the through hole 730 of the first ventilation pipe 710 which functions as a pipe member. Accordingly, it is possible to ensure a sufficient difference in temperature between the atmosphere around the opening part of the through hole 730 and the inside of the heat medium hole 3C. Accordingly, such a configuration is useful for enhancing the heat discharging efficiency by the medium. Further, the heat discharging efficiency can be enhanced by mounting the first ventilation pipe 710 which is a member separate from the heat conduction plate 2C. Accordingly, a sufficient degree of freedom in arrangement can be ensured with respect to the heat medium hole 3C and the first opening part 301 on a side where the first ventilation pipe 710 is mounted.

(d) As described in this embodiment, provided that the first joint 700 and the second joint 701 have the air-tightness and the heat insulating property, it is possible to generate the flow of the medium in the heat medium hole 3C with certainty. Accordingly, such a configuration is extremely useful for enhancing the heat discharging efficiency by the medium.

(3-iv) Modification

In this embodiment, the case where both the first ventilation pipe 710 and the second ventilation pipe 720 are mounted on the heat conduction plate 2C is exemplified. However, the present invention is not limited to such a configuration. The configuration example may be adopted where only either one of the first ventilation pipe 710 or the second ventilation pipe 720 is mounted on the heat conduction plate 2C. For example, in the case where only the second ventilation pipe 710 is mounted on the heat conduction plate 2C, such a configuration is extremely useful with respect to a point that a chimney effect can be generated irrespective of the extending direction of the heat medium hole 3C and a point that the heat discharging efficiency can be enhanced since a temperature difference can be ensured. For example, in the case where only the first ventilation pipe 710 is mounted on the heat conduction plate 2C, such a configuration is extremely useful with respect to a point that the heat discharging efficiency can be enhanced since a temperature difference can be ensured. In such a case, it is sufficient for the first ventilation pipe 710 to generate a chimney effect in substantially the same manner as the first embodiment.

4. Fourth Embodiment of the Present Invention

Next, a fourth embodiment of the present invention is described.

Also in the fourth embodiment, a point which makes the fourth embodiment different from the above-mentioned first to third embodiments is mainly described. That is, in the fourth embodiment, the constitutional elements substantially equal to the corresponding constitutional elements in the above-mentioned first to third embodiments are given the same symbols in the drawing, and the detailed explanation of these constitutional elements is omitted.

(4-i) Configuration of Cooling Structure of Electronic Component

In the above-mentioned first embodiment to the third embodiment, the case is described where the natural convection generated by heat convection is utilized. However, in the fourth embodiment, the case is exemplified where the flow of the medium which is forcibly generated is utilized. Further, with respect to the configuration relating to the heat medium hole through which a medium flows, any configurations of the above-mentioned first embodiment to the third embodiment are also applicable. However, in this embodiment, the case where the configuration example described in the first embodiment is applied is exemplified.

Figure 7:
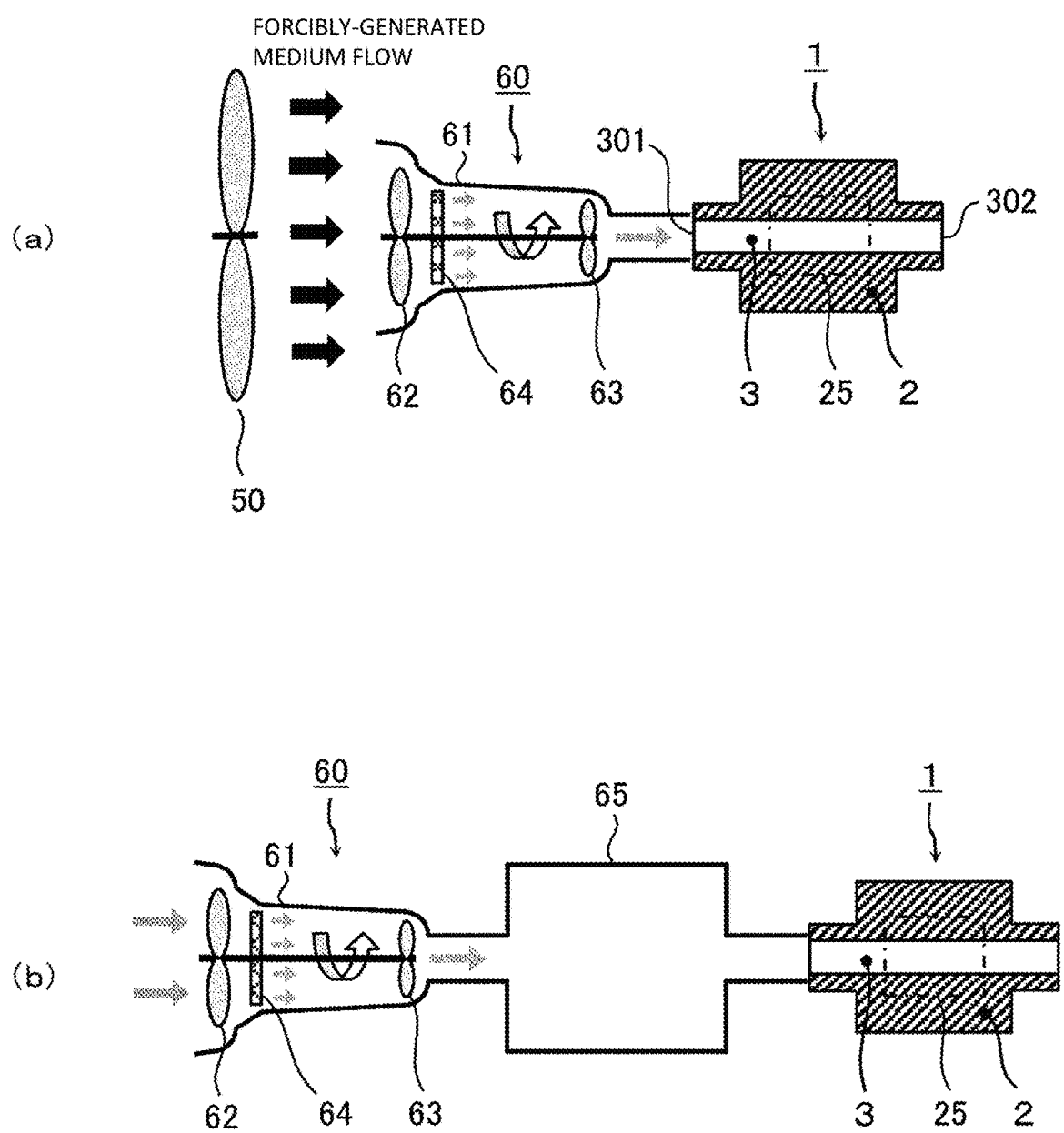
FIG. 7 is an explanatory view schematically showing a schematic configuration example of a cooling structure of an electronic component according to a fourth embodiment of the present invention, wherein FIG. 7(*a*) is a view showing one example of the schematic configuration of the cooling structure, and FIG. 7(*b*) is a view showing another example of the schematic configuration of the cooling structure.

FIG. 7 is an explanatory view schematically showing an overall configuration example of a cooling structure of an electronic component according to the fourth embodiment of the present invention. The example shown in the drawing schematically shows the overall configuration example of the cooling structure, and sizes and scales of the constitutional elements shown in the example are not always in accordance with actual sizes and scales.

(Entire Configuration)

As shown in FIG. 7(a), the cooling structure 1 of the electronic component according to the fourth embodiment is configured substantially in the same manner as the first embodiment. However, the fourth embodiment differs from the first embodiment with respect to the following points. In the fourth embodiment, the configuration is adopted where the flow of a medium in the heat medium hole 3 is generated by making use of the flow of a medium which is forcibly supplied from the outside of the heat medium hole 3. Accordingly, a fan 50 as a medium flow generator for forcibly generating a medium flow is provided on an extension of the extending direction of the heat medium hole 3. By forcibly generating a medium flow in this manner, a heat discharging effect and a cooling effect can be enhanced.

(Medium Flow Generator)

It is sufficient that the fan 50 as the medium flow generator is a fan which forcibly generates a medium flow. For example, the fan 50 can be formed using a propeller-type axial fan, a sirocco-type fan or a turbo-type centrifugal fan or the like. In this embodiment, provided that the medium flow generator can forcibly generate a medium flow, a medium flow generator is not limited to the fan 50. The medium flow generator may be a compressor, a pump or the like. Further, in the case where the medium flow generator is applied to the cooling structure of a vehicle-mounted electronic component, the medium flow generator may be configured to utilize a running air generated during running of a vehicle (transporter) by taking in the running air.

Further, the cooling structure may be configured to forcibly cool the electronic component using a radiator.

(Heat Medium Hole)

The heat medium hole 3 corresponds to a medium flow which is forcibly generated by the fan 50. The heat medium hole 3 is configured to generate the flow of the medium in the heat medium hole 3 by making use of the forcibly-generated medium flow. Accordingly, in the heat medium hole 3, the first opening part 301 which forms the medium inlet part to the heat medium hole 3 is disposed so as to be directed toward an upstream side of the forcibly-generated medium flow which the fan 50 generates. Accordingly, the medium is supplied to the inside of the heat medium hole 3. However, the present invention is not limited to such a configuration. For example, the second opening part 302 which forms the medium outlet part from the heat medium hole 3 may be disposed so as to be directed toward the downstream side of the forcibly-generated medium flow which the fan 50 generates. Also in this case, it is possible to generate the flow of the medium in the heat medium hole 3 by making use of a negative pressure of the forcibly-generated medium flow. That is, the fan 50 may be disposed on at least one of the first opening part 301 which forms the medium inlet part to the heat medium hole 3 and the second opening part 302 which forms the medium outlet part from the heat medium hole 3.

Further, the heat medium hole 3 corresponds to the forcibly-generated medium flow generated by the fan 50. Accordingly, at the time of using the electronic component 101, the heat medium hole 3 may be disposed so as to extend in the horizontal direction.

Further, the heat medium hole 3 corresponds to the forcibly-generated medium flow generated by the fan 50. Accordingly, it is not always necessary for the heat medium hole 3 to have a straight path from the first opening part 301 to the second opening part 302. For example, the heat medium hole 3 may be disposed so as to include a curved part, a bent part or the like at an intermediate part of the heat medium hole 3. When the path of the heat medium hole 3 has a straight shape, it is possible to prevent the heat medium hole 3 from becoming complicated. However, in the case where the heat medium hole 3 has a curved part, a bent part or the like, it is possible to selectively set the path of the heat medium hole 3 corresponding to the arrangement of the mounting scheduled region 25. Accordingly, such a path is preferable to perform discharging of heat (heat induction). Specifically, it is considered that the path of the heat medium hole 3 is set to have a wave-shaped part, a spiral-shaped part or the like as viewed in a normal direction. This also means that it is not always necessary to dispose the first opening part 301 and the second opening part 302 on each of two oppositely facing surfaces of the heat conduction plate 2. Specifically, for example, the first opening part 301 and the second opening part 302 may be disposed on the same surface of the heat conduction plate 2, or may be disposed on an upper surface, a lower surface or a side end surface of the heat conduction plate 2 in a distributed manner.

(Pressure Feeding Mechanism)

Here, the heat medium hole 3 corresponds to the forcibly-generated medium flow generated by the fan 50, and a medium flow is fed to the inside of the heat medium hole 3 from the first opening part 301. However, it is not always the case that the first opening part 301 which forms the medium inlet part to the heat medium hole 3 can ensure a sufficient hole cross-sectional area. In view of the above, it is preferable that a pressure feeding mechanism 60 which feeds a medium by pressure feeding to the inside of the heat medium hole 3 be provided at the first opening part 301 side which forms the medium inlet part to the heat medium hole 3. Since the pressure feeding mechanism 60 feeds the medium by pressure feeding, even in the case where the first opening part 301 has a small hole cross-sectional area, a medium flow can be efficiently fed to the inside of the heat medium hole 3 thus generating the flow of the medium in the heat medium hole 3 with certainty.

As the pressure feeding mechanism 60, for example, a pressure feeding mechanism 60 having the following configuration can be named. That is, the pressure feeding mechanism 60 includes: a funnel-shaped case part 61 having an inlet side thereof opened widely and an outlet side thereof throttled narrowly; a driven fan 62 which is disposed on an inlet side in the case part 61 and is rotatably operated by a medium flow from the fan 50; and a pressure-feeding fan 63 which is disposed on an outlet side in the case part 61 coaxially with the driven fan 62 and feeds the medium by pressure feeding due to the rotational operation along with the rotational operation of the driven fan 62. In the pressure feeding mechanism 60 having the above-mentioned configuration, an inlet side of the case part 61 is opened widely and hence, it is possible to efficiently take in a medium flow from the fan 50 into the case part 61. By disposing the driven fan 62 and the pressure-feeding fan 63 in the case part 61, the pressure feeding mechanism 60 can feed the medium into the heat medium hole 3 by pressure feeding without providing an additional drive source. Accordingly, it is possible to prevent the configuration from becoming complicated. Such a configuration is preferable for taking a measure to realize the miniaturization or the like of the cooling structure.

It is preferable that the pressure feeding mechanism 60 has a dustproof filter 64 in the case part 61. This is because, due to the provision of the dustproof filter 64 in the pressure feeding mechanism 60, it is possible to suppress the occurrence of a phenomenon that foreign substances or the like are mixed into a medium flowing in the heat medium hole 3.

(Medium Storing Chamber)

Even in the case where such a pressure feeding mechanism 60 is provided, when a forcibly-generated medium flow is stopped, there is a concern that the flow of a medium in the heat medium hole 3 is disappeared along with the stop of the forcibly-generated medium flow. As the case where the forcibly-generated medium flow is stopped, for example, the case is considered where a failure of the fan 50, a power source supply trouble or the like occurs. For example, in the case where a running air during running of the vehicle is utilized, a period where the vehicle is stopped corresponds to such a case. Even in the case where the forcibly-generated medium flow is stopped due to the above-mentioned reasons, it is not preferable that the flow of the medium in the heat medium hole 3 is disappeared immediately after the stop of the forcibly-generated medium flow. In view of the above, it is preferable that a medium storing chamber 65 which functions as a buffer tank for storing the medium is provided between the heat medium hole 3 and the pressure feeding mechanism 60 as shown in FIG. 7(b).

By providing such a medium storing chamber 65, the medium is temporarily stored in the medium storing chamber 65. Particularly, by providing the pressure feeding mechanism 60 on a pre-stage of the medium storing chamber 65, the medium which is fed by pressure feeding from the pressure feeding mechanism 60 is stored in the medium storing chamber 65 in a compressed state. Accordingly, even in the case where the forcibly-generated medium flow supplied from the outside is stopped, for example, during a period where the medium storing chamber 65 stores the medium, a medium flows in the heat medium hole 3 from the medium storing chamber 65, and the heat radiation is performed due to the flow of the medium and hence, there is no possibility that a cooling effect is obstructed.

As described above, it is sufficient for the configuration examples of this embodiment to include the following technical features.

(1) The heat medium hole 3 is formed in a through hole shape aiming at the heat radiation (heat dissipation) using the flow of the medium in the heat medium hole 3. For this end, the heat medium hole 3 extends in a predetermined extending direction, and makes the first opening part 301 as the medium inlet part provided on one surface of the heat conduction plate 2 and the second opening part 302 as the medium outlet part communicate with each other.

(2) As viewed in a normal direction, at least a part of the heat medium hole 3 overlaps with at least a part of the mounting scheduled region 25 for the electronic component 101 mounted on the insulation substrate 4.

(3) The first opening part 301 which forms the medium inlet part to the heat medium hole 3 is disposed so as to be directed toward an upstream side of the forcibly-generated medium flow, and the flow of the medium in the heat medium hole 3 is generated by making use of the forcibly-generated medium flow from the outside of the heat medium hole 3.

(4) It is preferable that the pressure feeding mechanism 60 which feeds a medium to the inside of the heat medium hole 3 by pressure feeding be provided to a side of the first opening part 301 which forms the medium inlet part to the heat medium hole 3.

(5) It is preferable that the medium storing chamber 65 for storing the medium be provided between the heat medium hole 3 and the pressure feeding mechanism 60.

(4-ii) Flows of Heat and Medium

In the cooling structure 1 of the electronic component according to this embodiment described above, firstly, the fan 50 is operated so that a medium flow is forcibly generated. When a medium flow is forcibly generated, the driven fan 62 and the pressure-feeding fan 63 of the pressure feeding mechanism 60 are rotatably operated corresponding to the forcibly-generated medium flow so that the medium taken into the case part 61 from the inlet side of the case part 61 is fed toward the first opening part 301 side in the heat medium hole 3 by pressure feeding. With such an operation, in the heat medium hole 3, the flow of the medium is generated in a direction from the first opening part 301 toward the second opening part 302. In such an operation, in the case where the medium storing chamber 65 is provided between the heat medium hole 3 and the pressure feeding mechanism 60, the medium is temporarily stored in the medium storing chamber 65. Accordingly, for example, also in the case where a medium flow which is forcibly generated by the fan 50 is stopped, during a period where the medium storing chamber 65 stores the medium, a medium flows in the heat medium hole 3 from the medium storing chamber 65.

When the flow of the medium is generated in the heat medium hole 3, heat which the electronic component 101 generates is discharged substantially in the same manner as the case of the first embodiment. That is, with respect to heat from the electronic component 101, firstly, "substantially most of heat" is discharged by the flow of the medium in the heat medium hole 3 and, then, "residual heat" transferred to the heat radiation fins 6 of the heat sink 5 is radiated by the heat radiation fins 6.

(4-iii) Advantageous Effects Acquired by this Embodiment

According to this embodiment, one or a plurality of advantageous effects described hereinafter can be acquired.

(a) Also in this embodiment, the radiation of heat is performed not only by the heat radiation fins 6 of the heat sink 5 but also by the flow of the medium in the heat medium hole 3 formed in the heat conduction plate 2 and hence, it is possible to acquire substantially the same advantageous effects as the case of the first embodiment.

(b) In the cooling structure 1 of the electronic component according to this embodiment, the first opening part 301 which forms the medium inlet part to the heat medium hole 3 is disposed so as to be directed toward an upstream side of the forcibly-generated medium flow, and the flow of the medium in the heat medium hole 3 is generated by making use of the forcibly-generated medium flow from the outside of the heat medium hole 3. That is, the flow of the medium in the heat medium hole 3 is generated by making use of a medium flow which is forcibly supplied. Accordingly, it is possible to generate the flow of the medium in the heat medium hole 3 with certainty and hence, such a configuration is extremely favorable for enhancing the cooling effect. Further, by making use of the forcibly-supplied medium flow, a degree of freedom in the arrangement of the extending direction of the heat medium hole 3, in the path of the heat medium hole 3 and the like can be enhanced and hence, such a configuration is favorable for realizing the miniaturization or the like of the cooling structure.

(c) In this embodiment, the fan 50 as the medium flow generator is disposed on the side of the first opening part 301 which forms the medium inlet part to the heat medium hole 3, and the fan 50 forcibly generates a medium flow. That is, the flow of the medium in the heat medium hole 3 is generated by making use of the fan 50 as the medium flow generator. Accordingly, in addition to an advantageous effect that such configuration becomes extremely favorable for enhancing a cooling effect by generating the flow of the medium in the heat medium hole 3 with certainty, and by controlling an operation of the fan 50, a flow rate, a flow speed and the like of the medium can be suitably set. As a result, it is possible to realize the enhancement of the controllability of a cooling effect.

(d) As described in this embodiment, provided that the pressure feeding mechanism 60 is provided on the first opening part 301 which forms the medium inlet part to the heat medium hole 3, the pressure feeding mechanism 60 can feed the medium in the heat medium hole 3 by pressure feeding. Accordingly, even in the case where the first opening part 301 has a small hole cross-sectional area, a medium flow can be efficiently fed to the inside of the heat medium hole 3 thus generating the flow of the medium in the heat medium hole 3 with certainty and hence, such a configuration becomes extremely favorable for enhancing a cooling effect.

(e) As described in this embodiment, provided that the pressure feeding mechanism 60 includes the driven fan 62 and the pressure-feeding fan 63, the pressure feeding mechanism 60 can feed the medium in the heat medium hole 3 by pressure feeding without requiring an additional drive source. Accordingly, it is possible to prevent the configuration from becoming complicated even in such a case while enhancing a cooling effect by pressure-feeding the medium and hence, such a configuration becomes favorable for realizing the miniaturization or the like of the cooling structure.

(f) Further, as described in this embodiment, provided that the pressure feeding mechanism 60 has the dustproof filter 64, it is possible to suppress the occurrence of a phenomenon that foreign substances and the like are mixed to a medium flowing in the heat medium hole 3.

(g) As described in this embodiment, provided that the medium storing chamber 65 is provided between the heat medium hole 3 and the pressure feeding mechanism 60, the medium (for example, the medium brought into a compressed state by being fed from the pressure feeding mechanism 60 by pressure feeding) is stored in the medium storing chamber 65. Accordingly, for example, even in the case where the forcibly-generated medium flow which is supplied from the outside is stopped, during a period where the medium storing chamber 65 stores the medium, a medium flows into the heat medium hole 3 from the medium storing chamber 65, and discharging of heat is performed by the flow of the medium and hence, there is no possibility that a cooling effect is disturbed.

(4-iv) Modification

In this modification, the case is mainly exemplified where a medium flow forcibly generated by the fan 50 is utilized for generating the flow of a medium in the heat medium hole 3. However, the present invention is not limited to such a configuration, and the present invention may be applied to the following constitutional examples.

Figure 8:
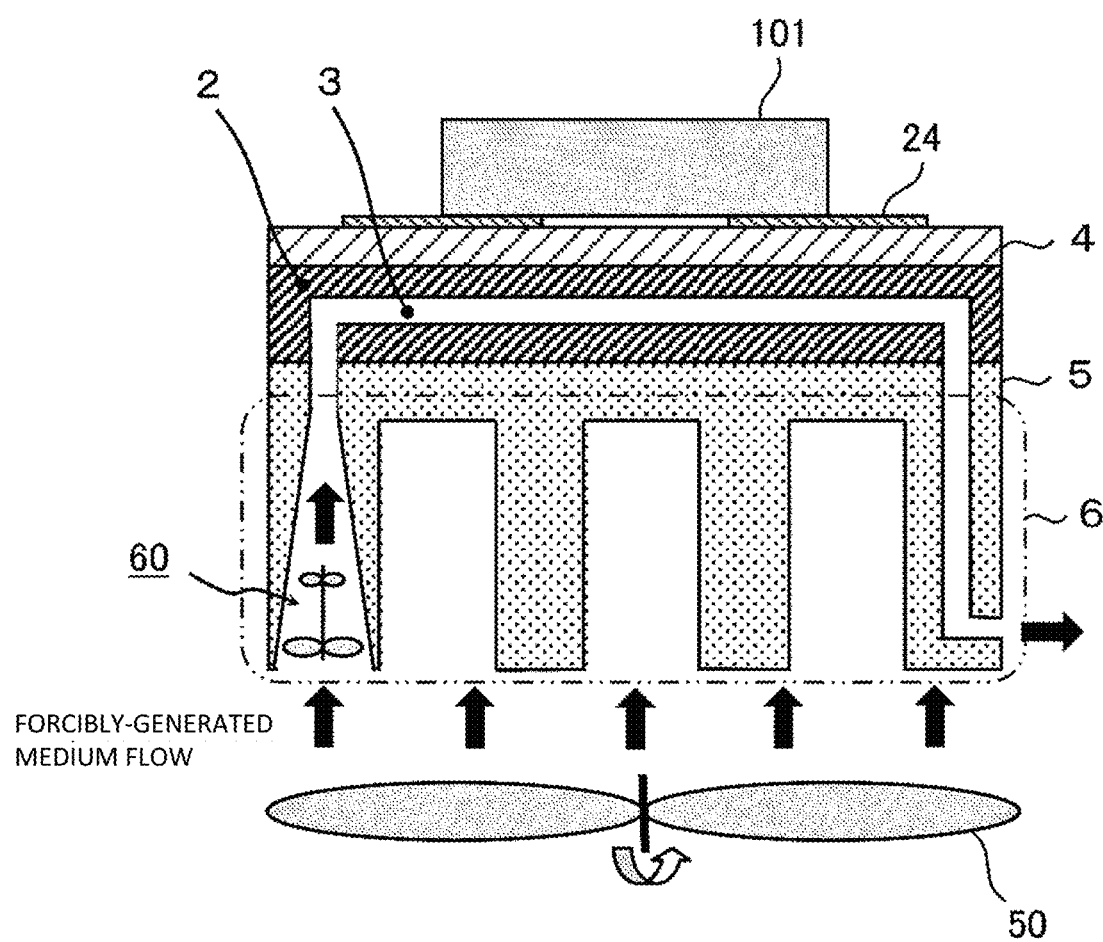
FIG. 8 is an explanatory view schematically showing another configuration example of the cooling structure of the electronic component according to the fourth embodiment of the present invention.

FIG. 8 is an explanatory view schematically showing another configuration example of the cooling structure of the electronic component according to the fourth embodiment of the present invention.

In the constitutional example shown in FIG. 8, the fan 50 and the heat radiation fin 6 are disposed such that a medium flow forcibly generated by the fan 50 is supplied not only to the inside of the heat medium hole 3 but also to the heat radiation fin 6 as the heat radiation structural part in the heat sink 5 as the heat radiation member. Specifically, the fan 50 is disposed so as to opposedly face the heat radiation fin 6 of the heat sink 5 so that the fan 50 forcibly generates a medium flow toward the heat radiation fin 6. The first opening part 301 which forms the medium inlet part to the heat medium hole 3 is provided in the heat radiation fin 6, and the pressure feeding mechanism 60 is incorporated in the heat radiation fin 6 at an area in the vicinity of the first opening part 301. Further, the heat radiation fin 6 is disposed such that the heat medium hole 3 which communicates with the pressure feeding mechanism 60 passes the mounting scheduled region 25 of the heat conduction plate 2.

With such a configuration example, a medium flow forcibly generated by the fan 50 has a function of accelerating the heat radiation by the heat radiation fin 6 by being supplied to the heat radiation fin 6 of the heat sink 5 in addition to a function of generating the flow of a medium in the heat medium hole 3. Accordingly, a medium flow has these functions and hence, it is possible to realize the further enhancement of a cooling effect.

5. Fifth Embodiment of the Present Invention

Next, the fifth embodiment of the present invention is described.

In the fifth embodiment, a point which makes the fifth embodiment different from the above-mentioned fourth embodiment is mainly described. That is, in the fifth embodiment, the constitutional elements substantially equal to the corresponding constitutional elements in the above-mentioned fourth embodiment are given the same symbols in the drawing, and the detailed explanation of these constitutional elements is omitted.

In the fifth embodiment, in the same manner as in the case of the above-mentioned fourth embodiment, the case is described where the flow of a medium is generated in the heat medium hole by making use of the forcibly-generated medium flow. With respect to the configuration relating to the heat medium hole through which a medium flows, any configurations of the above-mentioned first embodiment to the third embodiment are also applicable. However, in this embodiment, the description is made by taking the case where the configuration example described in the first embodiment is applied as an example.

(5-i) Configuration of Cooling Structure of Electronic Component

Figure 9:
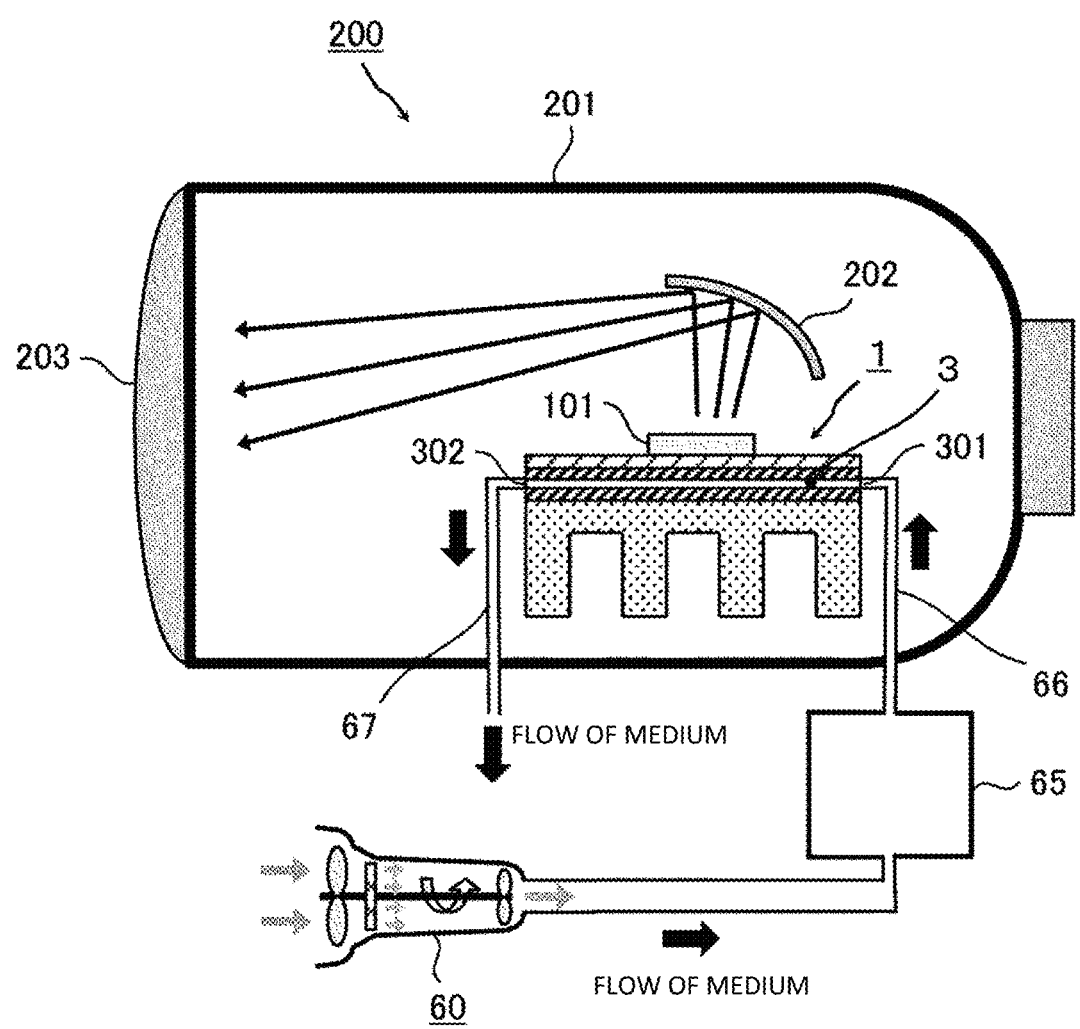
FIG. 9 is an explanatory view schematically showing an overall configuration example of a cooling structure of an electronic component according to a fifth embodiment of the present invention.

FIG. 9 is an explanatory view schematically showing an overall configuration example of a cooling structure of an electronic component according to the fifth embodiment of the present invention. The example shown in the drawing schematically shows the overall configuration example of the cooling structure, and sizes and scales of the constitutional elements shown in the example are not always in accordance with actual sizes and scales.

(Entire Configuration)

As shown in FIG. 9, although a cooling structure 1 of the electronic component according to the fifth embodiment has substantially the same configuration as the cooling structure of the first embodiment, the cooling structure 1 differs from the cooling structure of the first embodiment with respect to the following points.

In the fifth embodiment, an electronic component 101 is formed of a light emitting diode (LED) chip, and is used as a light source of a headlight 200 of an automobile such as a four-wheeled vehicle, a two-wheeled vehicle or the like, a railroad vehicle, an air plane, a ship, other transporting machines and the like (hereinafter simply and collectively referred to as a vehicle). Accordingly, for cooling the electronic component (LED chip) 101, the cooling structure 1 is disposed in a housing 201 of a headlight which is a hermetically sealed space.

In the fifth embodiment, by taking a running air generated during running of the vehicle as a forcibly-generated medium flow, the flow of the medium in the heat medium hole 3 is generated by making use of the forcibly-generated medium flow. Accordingly, the cooling structure 1 includes a first guide pipe part 66 which is mounted on the first opening part 301, and a second guide pipe part 67 which is mounted on the second opening part 302.

(Headlight)

In a headlight 200 on which an LED chip 101 is mounted, a hermetically sealed space is formed in the inside of the housing 201, and the LED chip 101 and a reflector 202 are disposed in the inside of the hermetically-sealed space. Further, by reflecting a radiation light from the LED chip 101 on the reflector 202, the light is radiated to a front side of the headlight 200 (radiation destination of light) by way of a lens part 203 which forms a part of the housing 201.

(Guide Pipe Part)

Both the first guide pipe part 66 and the second guide pipe part 67 have a tubular shape for guiding a medium flow.

The first guide pipe part 66 is mounted such that the first guide pipe part 66 is connected to the first opening part 301 which forms the medium inlet part to the heat medium hole 3, and is provided for introducing the forcibly-generated medium flow from the outside to the first opening part 301.

It is considered that mounting of the first guide pipe part 66 on the first opening part 301 is performed by making use of a first joint 700 described in the third embodiment in substantially the same manner as in the case of the first ventilation pipe 710 described in the third embodiment. However, the mounting of the first guide pipe part 66 on the first opening part 301 is not limited to such a method, and may be performed by making use of another known method. Further, with respect to the first guide pipe part 66, since a medium flow to be guided is forcibly generated, provided that the first guide pipe part 66 has a tubular shape which can guide a medium flow, there is no restriction in the arrangement of an inlet part, an outlet part and the like of the first guide pipe part 66, and the first guide pipe part 66 may have a bent part, a curved part and the like at an intermediate part of a pipe passage thereof.

The second guide pipe part 67 is mounted such that the second guide pipe part 67 is connected to the second opening part 302 which forms the medium outlet part from the heat medium hole 3, and is provided for introducing the forcibly-generated medium flow discharged from the second opening part 302 to the outside. It is considered that also the mounting of the second guide pipe part 67 on the second opening part 302 is performed by making use of the second joint 701 described in the third embodiment in substantially the same manner as in the case of the second ventilation pipe 720 described in the third embodiment. However, the mounting of the second guide pipe part 67 is not limited to such a method, and may be performed using another known method. Further, with respect to the second guide pipe part 67, since a medium flow to be guided is forcibly generated, provided that the second guide pipe part 67 has a tubular shape which can guide a medium flow, there is no restriction in the arrangement of an inlet part, an outlet part and the like of the second guide pipe part 67, and the second guide pipe part 67 may have a bent part, a curved part and the like at an intermediate part of a pipe passage thereof.

In this embodiment, the LED chip 101 and the heat medium hole 3 which passes an area in the vicinity of the LED chip 101 are disposed in the inside of the housing 201 of the headlight 200 (that is, hermetically-sealed space). Accordingly, the first guide pipe part 66 penetrates the housing 201, and is disposed so as to guide a medium flow supplied from the outside of the hermetically-sealed space to the heat medium hole 3 in the inside of the hermetically-sealed space. Further, the second guide pipe part 67 penetrates the housing 201, and is disposed so as to guide the flow of the medium in the heat medium hole 3 in the hermetically-sealed space to the outside of the hermetically-sealed space.

It is preferable that the pressure feeding mechanism 60 and the medium storing chamber 65 described in the fourth embodiment are disposed on the first guide pipe part 66 at a position in the vicinity of an end edge on a side opposite to a side where the first guide pipe part 66 is connected to the first opening part 301. This is because, when the pressure feeding mechanism 60 is provided, a medium flow can be fed efficiently, and when the medium storing chamber 65 is provided, it is possible to suppress the occurrence of a phenomenon that the flow of the medium is immediately disappeared even when the vehicle is stopped.

As described above, it is sufficient for the configuration examples of this embodiment to include the following technical features.

(1) The heat medium hole 3 is formed in a through hole shape aiming at the heat radiation (heat dissipation) using the flow of the medium in the heat medium hole 3. For this end, the heat medium hole 3 extends in a predetermined extending direction, and makes the first opening part 301 as the medium inlet part provided on one surface of the heat conduction plate 2 and the second opening part 302 as the medium outlet part communicate with each other.

(2) As viewed in a normal direction, at least a part of the heat medium hole 3 overlaps with at least a part of the mounting scheduled region 25 for the electronic component 101 mounted on the insulation substrate 4.

(3) The first guide pipe part 66 which guides a medium flow is connected to the first opening part 301 which forms the medium inlet part to the heat medium hole 3, and the second guide pipe part 67 which guides a medium flow is connected to the second opening part 302 which forms the medium outlet part from the heat medium hole 3.

(4) A side of the first guide pipe part 66 where the medium is taken into the first guide pipe part 66 (for example, an inlet side of the case part 61 of the installed pressure feeding mechanism 60) is disposed so as to be directed toward an upstream side of the forcibly-generated medium flow so that the flow of the medium in the heat medium hole 3 is generated by making use of the forcibly-generated medium flow from the outside of the heat medium hole 3.

(5) Preferably, in a case where the electronic component 101 and the heat medium hole 3 which passes an area in the vicinity of the electronic component 101 are disposed in the hermetically-sealed space, the first guide pipe part 66 guides a medium flow supplied from the outside of the hermetically-sealed space to the heat medium hole 3 in the hermetically-sealed space, and the second guide pipe part 67 guides the flow of the medium in the heat medium hole 3 to the outside of the hermetically sealed space.

(5-ii) Flow of Heat and Medium

In the cooling structure 1 of the electronic component according to this embodiment described above, first, when the vehicle runs, a medium flow is forcibly generated by the running of the vehicle. When a medium flow is forcibly generated, through the pressure feeding of the medium by the pressure feeding mechanism 60 and the temporarily storing of the medium in the medium storing chamber 65, the first guide pipe part 66 guides the flow of the medium to the first opening part 301 in the heat medium hole 3. With such an operation, in the heat medium hole 3, the flow of the medium is generated in a direction from the first opening part 301 toward the second opening part 302. Here, by the storing of the medium in the medium storing chamber 65, even in a case where the vehicle is stopped and the forcibly-generated medium flow is interrupted, during a period where the medium storing chamber 65 stores the medium, a medium flows in the heat medium hole 3 from the medium storing chamber 65.

When the flow of the medium is generated in the heat medium hole 3, heat which the LED chip 101 generates is discharged in substantially the same manner as in the case of the first embodiment. That is, with respect to heat from the LED chip 101, first, "substantially most of heat" is discharged by the flow of the medium in the heat medium hole 3 and, thereafter, "residual heat" transferred to the heat radiation fin 6 of the heat sink 5 is radiated by the heat radiation fin 6.

When the medium is discharged from the second opening part 302 of the heat medium hole 3, the second guide pipe part 67 guides the flow of the medium to the outside of the housing 201 of the headlight 200. Accordingly, even in a case where the LED chip 101 and the like are disposed in the housing 201 which is the hermetically-sealed space, it is possible to prevent the medium used for discharging heat from adversely influencing a gas and the like in the housing 201 while discharging heat from the LED chip 101 using the flow of the medium in the heat medium hole 2 and hence, it is possible to avoid the occurrence of the condensation in the inside of the housing 201, for example.

(5-iii) Advantageous Effect Acquired by this Embodiment

According to this embodiment, one or a plurality of advantageous effects described hereinafter can be acquired.

(a) Also in this embodiment, the radiation of heat is performed not only by the heat radiation fins 6 of the heat sink 5 but also by the flow of the medium in the heat medium hole 3 formed in the heat conduction plate 2 and hence, it is possible to acquire substantially the same advantageous effects as the case of the first embodiment.

(b) Also in this embodiment, the flow of the medium in the heat medium hole 3 is generated by making use of the forcibly-supplied medium flow and hence, it is possible to acquire substantially the same advantageous effects as in the case of the fourth embodiment.

(c) In this embodiment, the first guide pipe part 66 is connected to the first opening part 301 which forms the medium inlet part to the heat medium hole 3, and the second guide pipe part 67 is connected to the second opening part 302 which forms the medium outlet part from the heat medium hole 3 and hence, even in a case where the forcibly-generated medium flow is supplied at a part away from the heat medium hole 3, by guiding a medium flow through the first guide pipe part 66 and the second guide pipe part 67, the flow of the medium can be generated in the heat medium hole 3. Accordingly, the degree of freedom in arrangement of the electronic component 101, the heat medium hole 3 and the like can be sufficiently ensured.

(d) In this embodiment, in a case where the electronic component 101 and the heat medium hole 3 which passes an area in the vicinity of the electronic component 101 are disposed in the hermetically-sealed space, the first guide pipe part 66 guides a medium flow supplied from the outside of the hermetically-sealed space to the heat medium hole 3 in the hermetically-sealed space, and the second guide pipe part 67 guides the flow of the medium in the heat medium hole 3 to the outside of the hermetically sealed space. Accordingly, even in a case where the electronic component 101 and the like are disposed in the hermetically-sealed space, heat from the electronic component 101 can be discharged by the flow of the medium in the heat medium hole 3 thus acquiring the excellent cooling effect. Further, it is possible to avoid the occurrence of the condensation and the like in the hermetically-sealed space, for example, while there is no possibility that the medium used for discharging heat adversely influences the gas and the like in the hermetically-sealed space.

(5-iv) Modification

In this modification, the description is made by taking the case where the electronic component 101 is the LED chip which is used as the light source of the headlight 200 of the vehicle, and the cooling of the electronic component (LED chip) 101 is performed by taking a running air generated during running of the vehicle as a forcibly-generated medium flow as an example. However, the present invention is not limited to such a case, and may be applicable to the following constitutional example. For example, the electronic component 101 is not limited to the LED chip for the headlight, and the electronic component 101 may be disposed not in the hermetically-sealed space but in an open space. A forcibly-generated medium flow may be generated by the medium flow generator such as the fan 50 or the like substantially in the same manner as the case of the fourth embodiment.

Specifically, for example, the present invention is also applicable to configuration examples for cooling an electronic component for lighting equipment disposed on a ceiling or an area in the vicinity of the ceiling of the construction, an electronic component of a large-sized computer device or the like on which various electronic components are densely mounted, a vehicle-mounted electronic component which is disposed at a position in the vicinity of a heat source such as an engine and away from a cooler such as a radiator. These configuration examples become extremely favorable for acquiring an excellent cooling effect.

In this modification, the description is made by taking the case where both the first guide pipe part 66 and the second guide pipe part 67 are provided as an example. However, the present invention is not limited to such a configuration, and only one of the first guide pipe part 66 and the second guide pipe part 67 may be provided. Provided that at least one of the first guide pipe part 66 and the second guide pipe part 67 is provided, at least one of the first guide pipe part 66 and the second guide pipe part 67 guides a medium flow and hence, a degree of freedom in arrangement of the electronic component 101, the heat medium hole 3 and the like can be sufficiently ensured.

6. Another Embodiment

The detailed description has been made heretofore by taking the first embodiment to the fifth embodiment as examples of the embodiment for carrying out the present invention. However, the present invention is not limited to the above-mentioned respective embodiments, and various modifications are conceivable without departing from the gist of the present invention.

For example, the present invention is not always limited to the above-mentioned respective embodiments, and can be also realized by suitably combining the contents described in the respective embodiments with each other. Also in such a case, it is possible to acquire the technical advantageous effects described in the respective embodiments.

A known member having a cooling function may be combined to the cooling structural body or the cooling system of each embodiment. The cooling structural body or the cooling system of each embodiment is applicable to a device having a large heat generation amount such as an automobile controller, a solar power generator, a super computer or the like, or a device having a possibility that a heat generation amount causes a problem.

The cooling structural body or the cooling system of each embodiment is installed in a heat generating device such as a vehicle, a home electric appliance including light equipment, a computer, a robot, a laser device, a light exposure device, a detection device, a medical device, a communication instrument, a toy, a ship, an airplane, a drone and the like, and can be used for a heat generating device of such a device. Further, the cooling structural body or the cooling system of each embodiment is installed in the construction such as a house, a factory or the like, and can be used in such constructions.

7. Preferred Embodiment of the Present Invention

Hereinafter, the preferred embodiment of the present invention is additionally described.

(Additional Statement 1)

According to an aspect of the present invention, a cooling structural body is provided, wherein the cooling structural body comprises:

a heat radiating part having a mounting surface on which an electronic component is directly or indirectly mounted, wherein a medium flow path through which a medium can flow is provided in the heat radiating part.

(Additional Statement 2)

The cooling structural body according to additional statement 1 can be provided, wherein the heat radiating part has a heat radiating member having a heat radiating body part and a heat radiating structural part, and a part or all of the medium flow path extends in the heat radiating body part in a direction along the mounting surface.

(Additional Statement 3)

The cooling structural body according to additional statement 1 or 2 can be provided, wherein the heat radiating part has: a heat radiating member; and a heat conduction member provided to the heat radiating member and having the mounting surface, and a part or all of the medium flow path is provided in the heat conduction member.

(Additional Statement 4)

The cooling structural body according to any one of additional statements 1 to 3 can be provided, wherein the heat radiating part has: a heat radiating member having a heat radiating body part and a heat radiating structural part provided to the heat radiating body part; and a heat conduction member having the mounting surface, a part of the medium flow path is provided in the heat radiating body part, and a part of the medium flow path is provided in the heat conduction member.

(Additional Statement 5)

A cooling structural body comprising according to any one of additional statements 1 to 4 can be provided, wherein a flow of a medium in the medium flow path is generated by a heat convection.

(Additional Statement 6)

The cooling structural body according to any one of additional statements 1 to 5 can be provided, wherein a first opening part which forms a medium inlet part of the medium flow path is disposed below a second opening part which forms a medium outlet part of the medium flow path in a gravity direction.

(Additional Statement 7)

The cooling structural body according to any one of additional statements 1 to 6 can be provided, wherein the medium flow path has a part where a hole cross-sectional area or a hole capacity of the medium flow path on a medium inlet side is larger than a hole cross-sectional area or a hole capacity of the medium flow path on a medium outlet side.

(Additional Statement 8)

The cooling structural body according to any one of additional statements 1 to 7 can be provided, wherein the medium flow path is disposed so as to pass a mounting scheduled region corresponding to a region where the electronic component is scheduled to be mounted and a non-mounting scheduled region other than the mounting scheduled region, and a size of a hole cross-sectional shape of a part or all of the medium flow path positioned in the mounting scheduled region is larger than a size of a hole cross-sectional shape of the medium flow path positioned in the non-mounting scheduled region.

(Additional Statement 9)

The cooling structural body according to any one of additional statements 1 to 8 can be provided, wherein a heat insulating member is provided on at least one of a first opening part which forms a medium inlet part of the medium flow path and a second opening part which forms a medium outlet part of the medium flow path.

(Additional Statement 10)

The cooling structural body according to any one of additional statements 1 to 9 can be provided, wherein the heat radiating part has a protruding part in which the medium flow path is provided, and a first opening part which forms a medium inlet part of the medium flow path or a second opening part which forms a medium outlet part of the medium flow path is positioned on an edge of the protruding part.

(Additional Statement 11)

A cooling structural body according to any one of additional statements 1 to 10 can be provided, wherein a chimney member having a through hole is provided to a second opening part which forms a medium outlet part of the medium flow path, and the medium flow path and the through hole formed in the chimney member communicate with each other.

(Additional Statement 12)

The cooling structural body according to any one of additional statements 1 to 11 can be provided, wherein a pipe member having a through hole is provided to a first opening part which forms a medium inlet part of the medium flow path, and the medium flow path and the through hole of the pipe member communicate with each other.

(Additional Statement 13)

The cooling structural body according to any one of additional statements 1 to 12 can be provided, wherein the heat radiating part has: a heat radiating body part; and a heat radiating structural part provided to the heat radiating body part, and the medium flow path is also provided in the heat radiating structural part.

(Additional Statement 14)

A cooling system can be provided wherein the cooling system comprises:

a cooling structural body according to any one of additional statements 1 to 13; and a medium flow supply part configured to allow a medium to flow in the medium flow path of the cooling structural body.

(Additional Statement 15)

The cooling system according to additional statement 14 can be provided, wherein the medium flow supply part has a medium flow generator or a pressure-feed mechanism.

(Additional Statement 16)

The cooling system according to additional statement 14 or 15 can be provided, wherein the cooling system further comprises a medium storing chamber provided between the cooling structural body and the medium flow supply part and configured to store the medium.

(Additional Statement 17)

The cooling system according to any one of additional statements 14 to 16 can be provided, wherein the cooling system further comprises a guide pipe part provided between the cooling structural body and the medium flow supply part and configured to guide the medium to the medium flow path.

(Additional Statement 18)

The cooling system according to any one of additional statements 14 to 17 can be provided, wherein the cooling structural body is disposed in a sealed space, and a first guide pipe part configured to guide the medium to the medium flow path positioned in the sealed space and a second guide pipe part configured to guide the medium from the medium flow path to an outside of the sealed space are provided.

(Additional Statement 19)

The cooling system according to any one of additional statements 14 to 18 can be provided, wherein the medium flow supply part is configured to supply air, water or oil into the medium flow path of the cooling structural body.

(Additional Statement 20)

The cooling system according to any one of additional statements 14 to 19 can be provided, wherein the cooling structural body and the medium flow supply part are provided on a vehicle, and the medium flow supply part is configured to supply running air generated at a time of running of the vehicle to the medium flow path.

(Additional Statement 21)

A heat generator comprising the cooling structural body according to any one of additional statements 1 to 13 or the cooling system according to any one of additional statements 14 to 20 can be provided.

(Additional Statement 22)

A construction comprising the cooling structural body according to any one of additional statements 1 to 13 or the cooling system according to any one of additional statements 14 to 20 can be provided.

REFERENCE SIGNS LIST 1, 1A, 1B, 1C cooling structure of electronic component
2, 2B, 2C heat conduction plate
2x protruding part
3, 3A, 3B, 3C heat medium hole
4 insulation substrate
5, 5A, 5B heat sink (heat radiation member)
6, 6A, 6B heat radiation fin (heat radiation structural part)
25 mounting scheduled region
31 small cross-sectional area
32 large cross-sectional area
50 fan (medium flow generator)
60 pressure feeding mechanism
62 driven fan
63 pressure-feeding fan
64 dustproof filter
65 medium storing chamber
66 first guide pipe part
67 second guide pipe part
101 electronic component
229 heat insulating member
301 first opening part
302 second opening part
700 first joint
701 second joint
710 first ventilation pipe (pipe member)
720 second ventilation pipe (chimney member)
730, 740 through hole

The invention claimed is:

1. A cooling system comprising:
a cooling structural body including a heat radiating part having a mounting surface on which an electronic component is directly or indirectly mounted, and a medium flow path through which a medium can flow is provided in the heat radiating part; and
a medium flow supply part configured to allow a medium to flow in the medium flow path of the cooling structural body,
a housing which is a sealed space and in which both the electronic component and the cooling structural body are disposed,
wherein a first guide pipe part configured to guide the medium to the medium flow path positioned in the housing which is the sealed space and inside the cooling structural body is provided, and
wherein a second guide pipe part configured to guide the medium from the medium flow path to an outside of the housing which is the sealed space is provided,
wherein the cooling structural body and the medium flow supply part are provided on a vehicle, and
wherein the medium flow supply part is configured to supply running air generated at a time of running of the vehicle to the medium flow path.

2. The cooling system according to claim 1, wherein the medium flow supply part has a medium flow generator or a pressure-feed mechanism.

3. The cooling system according to claim 1, further comprising a medium storing chamber provided between the cooling structural body and the medium flow supply part and configured to store the medium.

4. The cooling system according to claim 1, wherein the medium flow supply part is configured to supply air, water or oil into the medium flow path of the cooling structural body.

5. The cooling system according to claim 1, wherein a flow of a medium in the medium flow path is generated by a heat convection.

6. The cooling system according to claim 1, wherein the medium flow path has a part where a hole cross-sectional area of the medium flow path on a medium inlet side is larger than a hole cross-sectional area of the medium flow path on a medium outlet side.

7. The cooling system according to claim 1, wherein the medium flow path is disposed so as to pass a mounting scheduled region corresponding to a region where the electronic component is scheduled to be mounted and a non-mounting scheduled region other than the mounting scheduled region, and
a size of a hole cross-sectional shape of a part or all of the medium flow path positioned in the mounting scheduled region is larger than a size of a hole cross-sectional shape of the medium flow path positioned in the non-mounting scheduled region.

8. The cooling system according to claim 1, wherein a heat insulating member is provided on at least one of a first opening part which forms a medium inlet part of the medium flow path and a second opening part which forms a medium outlet part of the medium flow path.

9. The cooling system according to claim 1, wherein the heat radiating part has a protruding part in which the medium flow path is provided, and
a first opening part which forms a medium inlet part of the medium flow path or a second opening part which forms a medium outlet part of the medium flow path is positioned on an edge of the protruding part.

10. A cooling system according to claim 1, wherein a chimney member having a through hole is provided to a second opening part which forms a medium outlet part of the medium flow path, and
the medium flow path and the through hole formed in the chimney member communicate with each other.

11. The cooling system according to claim 1, wherein a pipe member having a through hole is provided to a first opening part which forms a medium inlet part of the medium flow path, and
the medium flow path and the through hole of the pipe member communicate with each other.

12. The cooling system according to claim 1, wherein the heat radiating part has: a heat radiating body part; and a heat radiating structural part provided to the heat radiating body part, and
the medium flow path is provided in the heat radiating structural part.

13. A cooling system according to claim 1, wherein an insulation substrate, on which the electronic component is directly or indirectly mounted, is provided on the mounting surface,
the heat radiating part has: a heat radiating member having a heat radiating body part; and a heat conduction member provided on the heat radiating member, being made of metal, and having the mounting surface,
a part of the medium flow path is provided in the heat radiating body part,
a part of the medium flow path is provided in the heat conduction member,
the medium flow path is not provided in the insulation substrate,
the medium flow path provided in the heat conduction member communicates with the medium flow path provided in the heat radiating body part, and does not communicate with the mounting surface, and
the medium is a gas.

14. The cooling system according to claim 13, wherein the heat radiating member has: a heat radiating body part; and heat radiating fins provided to the heat radiating body part,
a part of the medium flow path extends in a direction along the mounting surface in the heat conduction member, and
the heat radiating member is made of a material different from a material of the heat conduction member.

15. The cooling system according to claim 13, wherein the medium flow path is provided in the heat radiating fins.

16. The cooling system according to claim 13, wherein the electronic component is a semiconductor chip, an integrated circuit device, transistor or a capacitor,
a part of the medium flow path extends in the heat radiating body part in a direction along the mounting surface, and
a part of the medium flow path extends in the heat conduction member in a direction along the mounting surface.

17. A heat generator comprising the cooling system according to claim 1.

18. A construction comprising the cooling system according to claim 1.

* * * * *